(12) United States Patent
Weingartner et al.

(10) Patent No.: US 10,520,570 B2
(45) Date of Patent: Dec. 31, 2019

(54) SYSTEM AND METHOD FOR TISSUE CHARACTERIZATION USING MULTISLICE MAGNETIC RESONANCE IMAGING

(71) Applicant: BETH ISRAEL DEACONESS MEDICAL CENTER, INC., Boston, MA (US)

(72) Inventors: Sebastian Weingartner, Heidelberg (DE); Reza Nezafat, Waban, MA (US)

(73) Assignee: BETH ISRAEL DEACONESS MEDICAL CENTER, INC., Boston, MA (US)

( * ) Notice: Subject to any disclaimer, the term of this patent is extended or adjusted under 35 U.S.C. 154(b) by 856 days.

(21) Appl. No.: 14/706,520

(22) Filed: May 7, 2015

(65) Prior Publication Data
US 2015/0323630 A1   Nov. 12, 2015

Related U.S. Application Data

(60) Provisional application No. 61/991,033, filed on May 9, 2014.

(51) Int. Cl.
*G01R 33/54* (2006.01)
*G01R 33/565* (2006.01)
(Continued)

(52) U.S. Cl.
CPC ....... *G01R 33/543* (2013.01); *G01R 33/4835* (2013.01); *G01R 33/50* (2013.01); *G01R 33/56509* (2013.01)

(58) Field of Classification Search
CPC ............... G01R 33/50; G01R 33/5602; G01R 33/56509; G01R 33/543; G01R 33/5673; G01R 33/567
See application file for complete search history.

(56) References Cited

U.S. PATENT DOCUMENTS

| 6,903,548 B2 | 6/2005 | Foo |
| 7,412,277 B1 | 8/2008 | Saranathan et al. |

(Continued)

FOREIGN PATENT DOCUMENTS

| JP | 2006-130062 A | 5/2006 |
| JP | 200899889 A | 5/2008 |

(Continued)

OTHER PUBLICATIONS

Communication dated Oct. 14, 2015 by the European Patent Office in related Application No. 15167108.8.
(Continued)

*Primary Examiner* — Huy Q Phan
*Assistant Examiner* — Dustin R Dickinson
(74) *Attorney, Agent, or Firm* — Sughrue Mion, PLLC

(57) ABSTRACT

An MRI method includes: performing a first data acquisition block of a pulse sequence to acquire a first MR data from a plurality of slices of a subject during a period of fully recovered longitudinal magnetization within the plurality of slices disposed at different locations in the subject; performing a second data acquisition block of the pulse sequence including a magnetization preparation module followed by a recovery period and an imaging sequence executed during the recovery period, to acquire a second MR data from the plurality of slices during the recovery period; and generating a T1 map of the subject based on the first MR data and the second MR data, of the plurality of slices.

23 Claims, 17 Drawing Sheets

(51) Int. Cl.
*G01R 33/483* (2006.01)
*G01R 33/50* (2006.01)

(56) References Cited

U.S. PATENT DOCUMENTS

| | | | | |
|---|---|---|---|---|
| 7,622,919 | B2* | 11/2009 | Song | G01N 24/081 |
| | | | | 324/307 |
| 7,706,855 | B1* | 4/2010 | Priatna | A61B 5/055 |
| | | | | 324/306 |
| 7,809,426 | B2 | 10/2010 | Kim et al. | |
| 9,788,753 | B2* | 10/2017 | Assaf | A61B 5/055 |
| 2004/0059213 | A1* | 3/2004 | Kassai | A61B 5/055 |
| | | | | 600/410 |
| 2006/0253015 | A1* | 11/2006 | Nezafat | G01R 33/5635 |
| | | | | 600/410 |
| 2008/0004518 | A1 | 1/2008 | Stehning et al. | |
| 2008/0064951 | A1 | 3/2008 | Kitane et al. | |
| 2010/0290683 | A1* | 11/2010 | Demeester | A61B 6/037 |
| | | | | 382/131 |
| 2011/0181285 | A1 | 7/2011 | Greiser | |
| 2011/0312002 | A1* | 12/2011 | Taktak | G01R 33/465 |
| | | | | 435/13 |
| 2012/0232378 | A1 | 9/2012 | Messroghli | |
| 2014/0128720 | A1* | 5/2014 | Gallez | A61B 5/055 |
| | | | | 600/411 |
| 2014/0200435 | A1 | 7/2014 | Edelman et al. | |
| 2015/0077106 | A1* | 3/2015 | Kim | G01R 33/4828 |
| | | | | 324/309 |

FOREIGN PATENT DOCUMENTS

| | | |
|---|---|---|
| JP | 2011-83592 A | 4/2011 |
| JP | 5441568 B2 | 3/2014 |
| KR | 1020130086180 A | 7/2013 |
| KR | 1020140025267 A | 3/2014 |

OTHER PUBLICATIONS

Zhu et al., "Full-Brain T1 Mapping through Inversion Recovery Fast Spin Echo Imaging with Time-Efficient Slice Ordering", Proceedings of the International Society for Magnetic Resonance in Medicine, 12th Meeting, May 15-21, 2004, 1 total page.
Haselgrove et al., "A Method for Fast Multislice T1 Measurement: Feasibility Studies on Phantoms, Young Children, and Children with Canavan's Disease", Journal of Resonance Imaging, vol. 11, No. 4, Apr. 1, 2000, 8 total pages.
Jahng et al., "Sensitive and fast T1 mapping based on two inversion recovery images and a reference image", American Association of Physicists in Medicine, vol. 32, No. 6, May 13, 2005, 5 total pages.
Ordidge et al., "High-Speed Multislice T1 Mapping Using Inversion-Recovery Echo-Planar Imaging", Magnetic Resonance in Medicine, vol. 16, No. 2, Nov. 1, 1990, 8 total pages.
Daniel R. Messroghli, et al. "Modified Look-Locker Inversion Recovery (MOLLI) for High-Resolution T1 Mapping of the Heart", Magnetic Resonance in Medicine, 2004, pp. 141-146.
Amna Abdel-Gadir et al., "Myocardial T1 mapping: where are we now and where are we going?", Research Reports in Clinical Cardiology, Nov. 26, 2014, pp. 339-347.
Peter Kellman et al., "T1-mapping in the heart: accuracy and precision", Journal of Cardiovascular Magnetic Resonance, 2014, pp. 1-20.
James C Moon, et al., "Myocardial T1 mapping and extracellular volume quantification: a Society for Cardiovascular Magnetic Resonance (SCMR) and CMR Working Group of the European Society of Cardiology consensus statement", Journal of Cardiovascular Magnetic Resonance, 2013, pp. 1-12.
Kelvin Chow, et al., "Saturation Recovery Single-Shot Acquisition (SASHA) for Myocardial T1 Mapping", Magnetic Resonance in Medicine, 2014, pp. 2082-2095.
Stefan K Piechnik, et al., "Shortened Modified Look-Locker Inversion recovery (ShMOLLI) for clinical myocardial T1-mapping at 1.5 and 3 T within a 9 heartbeat breathhold", Journal of Cardiovascular Magnetic Resonance, 2010, pp. 1-11.
Sebastian Weingärtner, et al., "Free-Breathing Multislice Native Myocardial T1 Mapping Using the Slice-Interleaved T1 (STONE) Sequence", Magnetic Resonance in Medicine, 2014, pp. 1-10.
"Prior Art Search Report", Patent Information Promotion Center, Korea Institute of Patent Information, dated Aug. 13, 2014, 18 pgs. total.
Communication dated Jul. 1, 2016, issued by the Korean Intellectual Property Office in counterpart Korean Application No. 10-2015-0064397.

* cited by examiner

SYSTEM AND METHOD FOR TISSUE CHARACTERIZATION USING MULTISLICE MAGNETIC RESONANCE IMAGING

CROSS REFERENCE TO RELATED APPLICATION

This application claims the benefit of U.S. Provisional Application No. 61/991,033, filed May 9, 2014, the disclosure of which is incorporated herein in its entirety by reference.

BACKGROUND

1. Field

Apparatuses and methods consistent with exemplary embodiments relate to magnetic resonance imaging (MRI), and, more particularly, to T1 tissue characterization using a multi-slice imaging.

2. Related Art

When a substance such as human tissue is subjected to a uniform magnetic field, i.e., a static magnetic field $B_0$, the individual magnetic moments of the nuclear spins in the tissue attempt to align with the static magnetic field $B_0$, but precess about it in random order at their characteristic Larmor frequency. A net magnetization moment $M_z$ is generated in the direction of the static magnetic field $B_0$, but the randomly oriented magnetic components in the perpendicular plane, i.e., transverse x-y plane, cancel one another. If, however, the substance is subjected to a magnetic excitation field $B_1$ which is in the x-y plane and which is near the Larmor frequency, the net magnetization aligned moment $M_z$ may be rotated, i.e., tipped, into the x-y plane to generate a net transverse magnetic moment $M_t$, which is spinning in the x-y plane at the Larmor frequency. An MR signal is emitted by the excited nuclei, i.e., spins, after the excitation magnetic field $B_1$ is terminated, and the MR signal may be received by a radio-frequency (RF) coil and processed to form an image.

In MRI systems, the amplitude of the MR signal is dependent on the spin-lattice relaxation process that is characterized by the time constant T1, i.e., a spin-lattice relaxation time. It describes the recovery of the net magnetic moment M to its equilibrium value along the axis of magnetic polarization, i.e., z-magnetization.

Advances in cardiac MR (CMR) allow for the non-invasive imaging of interstitial diffuse fibrosis using quantitative T1 mapping. In this technique, the voxel-wise calculation of the longitudinal magnetization recovery time provides spatially-resolved quantitative characterization of the myocardial tissue composition. The myocardial T1 times vary between various cardiomyopathies, and both native, i.e., non-contrast, and post-contrast myocardial T1 times have been used to evaluate patients with various cardiomyopathies. Furthermore, extra-cellular volume (ECV) may be calculated by measuring native and post-contrast T1, taking into account the patient hematocrit.

Lately, various imaging pulse sequences have been proposed for myocardial T1 mapping, as for example, the modified look-locker inversion recovery (MOLLI) pulse sequence. However, to overcome the problem of time-consuming long rest periods between the inversion pulses, MOLLI samples the longitudinal magnetization recovery curve multiple times after a single magnetization preparation pulse, which hinders the accuracy. Thus, MOLLI suffers from inaccurate T1 estimates due to the heart rate, sensitivity to T2 times, and magnetization transfer dependencies.

To reduce the scan time and eliminate heart rate variability, variations of the MOLLI pulse sequence have been proposed, as for example, the 5(3)3 MOLLI or the shortened MOLLI (ShMOLLI). However, these sequences still suffer from inaccurate measurements leading to underestimated T1 of a healthy myocardium by up to approximately 30 percent.

Therefore, there is a need for an accurate and precise T1 mapping imaging sequence.

Additionally, myocardial T1 mapping is frequently performed using a two-dimensional (2D) sequence during breath-holds, with the acquisition of a single breath-hold per slice. Many methods have been proposed which use a single mid left ventricular (LV) slice for the calculation of T1 maps, and report a single T1 time for each patient. However, a single value might not characterize the regional myocardial tissue composition over the entire ventricle. While in some myopathies, such as amyloidosis, there might not be much variation across the myocardium, in many other cardiomyopathies, such as hypertrophic cardiomyopathies, there may be regional variations that could directly impact T1 measurements. Therefore, full LV coverage is needed for accurate characterization of the LV myocardium.

Currently, multiple separate 2D scans have to be performed for different slices to obtain a complete LV coverage in clinical practice. This requires numerous breath-holds, which inconvenience the patients.

Thus, methods and apparatuses are needed for improved T1 mapping that meets the needs of clinical applications using clinically-available resources and improves scan times and convenience of patients.

SUMMARY

Exemplary embodiments address at least the above problems and/or disadvantages and other disadvantages not described above. Also, the exemplary embodiments are not required to overcome the disadvantages described above, and may not overcome any of the problems described above.

One or more exemplary embodiments provide apparatuses and methods for free-breathing multi-slice T1 mapping with volumetric coverage entire ventricle by interleaving data acquisition of different unperturbed slices during the recovery time of adjacent slices.

One or more exemplary embodiments provide a slice-interleaved T1 (STONE) pulse sequence for free-breathing multi-slice inversion recovery based T1 mapping, with volumetric LV coverage.

In accordance with one aspect, there is provided a method for controlling an MRI system using a pulse sequence to acquire images of a subject. The method includes controlling the MRI apparatus to perform a first acquisition block of a pulse sequence to acquire MR data from a plurality of slices during a period of fully recovered longitudinal magnetization within the plurality of slices. The method also includes controlling the MRI apparatus to perform a second acquisition block of the pulse sequence that includes a single inversion of longitudinal magnetization followed by a corresponding recovery period and to acquire MR data from the plurality of slices during the recovery period using slice-selective excitation pulses. The method further includes repeating the preceding step a plurality of times to acquire data from the plurality of slices and generating a report including at least a T1 map of the subject across the plurality of slices.

In accordance with another aspect, there is provided an MRI system that includes a magnet system configured to generate a polarizing magnetic field about at least a portion of a subject arranged in the MRI apparatus and a plurality of gradient coils configured to establish at least one magnetic gradient field to the polarizing magnetic field. The MRI apparatus also includes an RF system configured to generate RF pulses and acquire medical imaging data from a subject arranged with in the MRI apparatus and a computer system configured to control operation of the magnet system, the plurality of gradient coils, and the RF system. The computer system is configured to control the plurality of gradient coils and RF system to perform a first acquisition block of a pulse sequence to acquire MR data from a plurality of slices during a period of fully recovered longitudinal magnetization within the plurality of slices. The computer system is further configured to control the plurality of gradient coils and RF system to perform a second acquisition block of the pulse sequence that includes a single inversion of longitudinal magnetization followed by a corresponding recovery period and to acquire MR data from the plurality of slices during the recovery period using slice-selective excitation pulses. The computer system is also configured to repeat the preceding step a plurality of times to acquire data from the plurality of slices and to generate a report including at least a T1 map of the subject across the plurality of slices.

BRIEF DESCRIPTION OF THE DRAWINGS

The discussed above aspects and/or other aspects will become more apparent by describing certain exemplary embodiments with reference to the accompanying drawings, in which.

DETAILED DESCRIPTION

Figure 1:
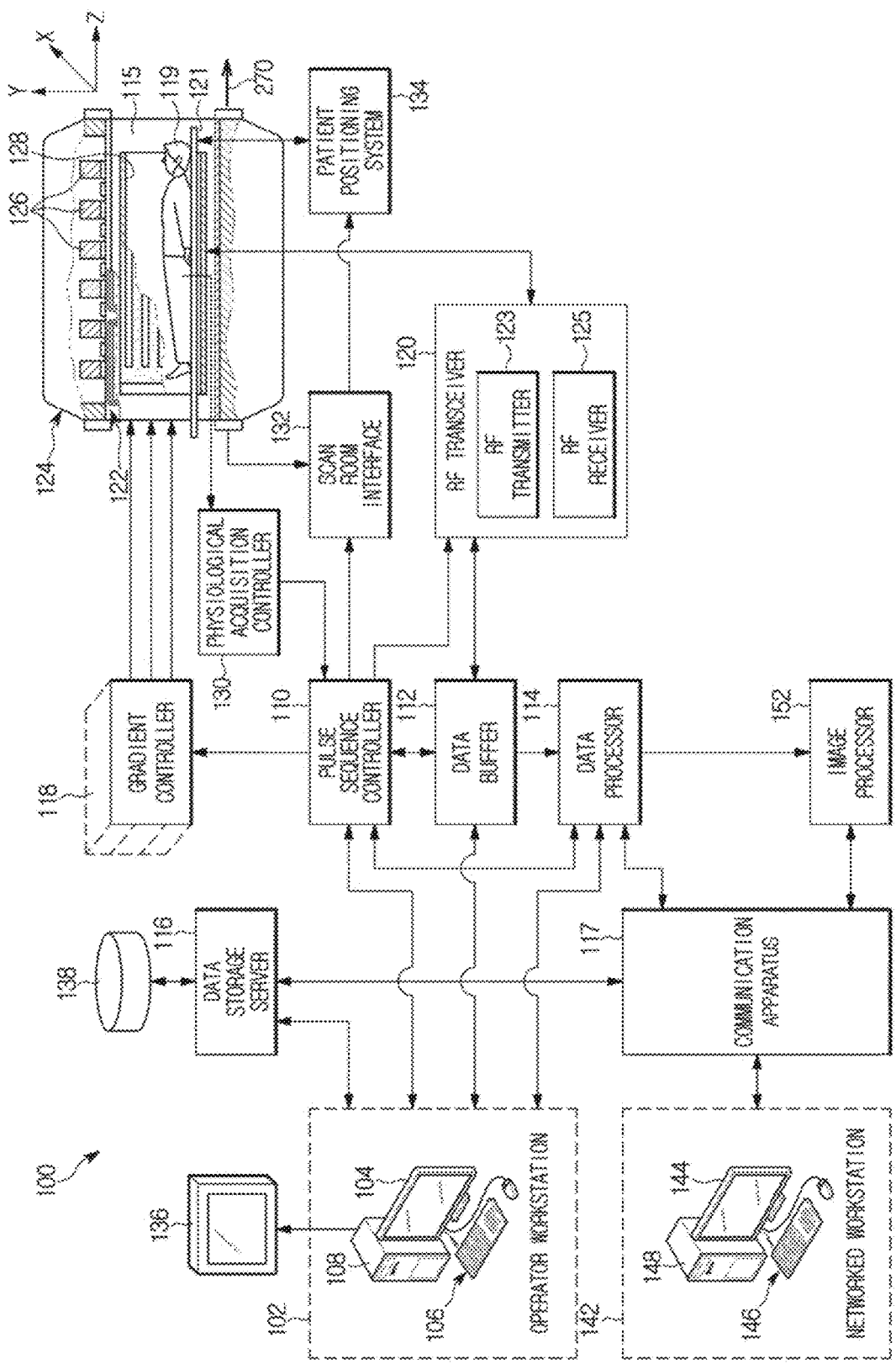
FIG. 1 is a block diagram of an MRI apparatus according to an exemplary embodiment.

Certain exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments may be practiced without those specifically defined matters. Also, well-known functions or constructions are not described in detail since they would obscure the description with unnecessary detail.

Referring to FIG. 1, an example of an MRI apparatus 100 is illustrated. The MRI apparatus 100 includes a magnet assembly 124, an operator workstation 102, including a display 104, one or more input devices 106, such as a keyboard, mouse, microphone, joystick, etc., and a processor 108. The operator workstation 102 provides the operator interface that enables scan orders to be entered into the MRI apparatus 100. For example, the operator workstation 102 may be coupled to at least one of a pulse sequence controller 110, a data buffer 112, a data processor 114, a data storage server 116, and an image processor 152, which may be interconnected with one another via a communication apparatus 117, which may include any suitable network interface, to provide a connection wirelessly and/or by wire. As an example, the communication apparatus 117 may include a proprietary network, a dedicated network, and/or an open network, such as the Internet.

The magnet assembly 124 includes a main magnet 126, a gradient coil assembly 122, and an RF coil assembly 128 which are sequentially arranged in that order from outermost side to the bore 115. The subject 119, i.e., a patient, is located on the cradle 121 which is moved to the bore 115 of the magnet system 124, such that a magnetic field may be applied to the subject 119. The main magnet 126 may be an open magnet.

The main magnet 126 generates a static magnetic field $B_0$ in the bore 115 of the magnet system 124. A direction of the static magnetic field $B_0$ may be parallel or perpendicular to a body axis 270 of the subject 119, i.e., to a longitudinal direction of the subject 119.

The pulse sequence controller 110 functions in response to instructions received from the operator workstation 102 to operate a gradient controller 118 and an RF transceiver 120.

Gradient waveforms to perform the prescribed scan are generated and applied to the gradient controller 118. The gradient controller 118 is connected with gradient coils of a gradient coil assembly 122, and outputs signal pulses to form the magnetic field gradients. The gradient controller 118 may include driving circuits corresponding to X, Y, and Z gradient coils of the gradient coil assembly 122 that respectively generate the magnetic field gradients in X-axis, Y-axis, and Z-axis directions that are orthogonal to each other and are used for position encoding and slice selection.

The RF transceiver 120 is connected with the RF coil assembly 128 to apply an RF pulse and/or a signal related to application of the RF pulse to the RF coil assembly 128. As illustrated in FIG. 1, the RF coil assembly 128 may include a whole-body RF coil which may serve as a transmit/receive coil. Additionally or optionally, the RF coil assembly 128 may include a local RF coil or coils which may be configured to transmit the RF pulse to and/or receive the MR signals from the subject. For example, in the case of the cardiac imaging, a cardiac receiving coil array may be used, for example, a 32-channel coil array.

For example, the RF transceiver 120 may include an RF transmitter 123 which transmits the RF pulse sequence to the whole-body coil or the local coil of the RF coil assembly 128, to apply RF pulses to the subject, to perform the prescribed magnetic resonance pulse sequence. The MR signals from the subject may be detected by the whole-body coil or the local coil of the RF coil assembly 128 and may be received by an RF receiver 125 of the RF transceiver 120, where they are amplified, demodulated, filtered, and digitized based on commands received from the pulse sequence controller 110. The RF transmitter 123 may generate a wide variety of RF pulses used in MRI pulse sequences. In response to the scan prescription and control of the pulse sequence controller 110, the RF transmitter 123 may generate RF pulses of desired frequency, phase, and pulse amplitude.

The RF receiver 125 may include one or more RF receiver channels. Each RF receiver channel may include an associated RF preamplifier that amplifies the MR signal received by the RF coil assembly 128, and a detector that detects and digitizes the in phase and quadrature components of the received MR signal. The magnitude of the received MR signal may, therefore, be determined at any sampled point by the square root of the sum of the squares of the in phase and quadrature components, i.e., I and Q channels:

$$M=\sqrt{I^2+Q^2}$$ Equation (1).

The phase of the received MR signal may be determined as:

$$\varphi = \tan^{-1}\left(\frac{Q}{I}\right).$$ Equation (2)

The pulse sequence controller 110 may optionally receive patient data from a physiological acquisition controller 130. For example, the physiological acquisition controller 130 may receive physiological information signals from different sensors connected to the subject 119, such as electrocardiograph (ECG) signals and/or respiratory signals indicating a respiratory expansion from respiratory bellows or other respiratory monitoring device. The physiological information signals may be used by the pulse sequence controller 110 to synchronize, or gate, the execution of the scan with the subject's heart beat and/or respiration. However, this is not limiting.

The pulse sequence controller 110 may be connected to a scan room interface 132 that receives signals from various sensors associated with the subject 119 and/or the magnet assembly 124. For example, the scan room interface 132 provides commands to a patient positioning system 134 to move the subject 119 on the cradle 121 to desired positions during the scan.

The digitized MR signal samples generated by the RF transceiver 120 are received by the data buffer 112. The data buffer 112 operates in response to instructions received from the operator workstation 102 to receive the real-time magnetic resonance data and provides buffer storage, such that no data is lost by data overrun.

In the scans that require information derived from acquired magnetic resonance data to control the further performance of the scan, the data buffer 112 may be controlled to generate such information and convey it to the pulse sequence controller 110. For example, during prescans, magnetic resonance data may be acquired and used to calibrate the pulse sequence performed by the pulse sequence controller 110. As another example, navigator signals may be acquired and used to adjust the operating parameters of the RF transceiver 120 and/or the gradient controller 118, or to control the view order in which k-space is sampled. As another example, the data buffer 112 may process MR signals used to detect the arrival of a contrast agent, for example, in an MR angiography (MRA) scan. For example, the data buffer 112 acquires magnetic resonance data and processes it in real-time to generate information that is used to control the scan.

The data processor 114 receives magnetic resonance data from the data buffer 112 and processes it in accordance with instructions downloaded from the operator workstation 102. The data processor 114 may obtain image data sets having different MR parameter values to generate an MR parameter map. The MR parameter map may include at least one of a T1 map, a T2 map, etc. An image processor 152 may reconstruct an MR image and/or form the MR parameter map based on the obtained data set. For example, the image processor 152 may perform at least one of reconstructing 2D or 3D images by performing a Fourier transformation of raw k-space data, performing image reconstruction algorithms, such as iterative or backprojection reconstruction algorithms, applying filtering to the raw k-space data or to the reconstructed image data, generating functional magnetic resonance (fMR) images, calculating motion or flow images, and so on.

Images reconstructed by the image processor 152 may be transferred to the operator workstation 102 and/or stored. Real-time images may be stored in a database memory cache (not shown), from which the images may be output to operator display 112 or a display 136 that is located near the magnet assembly 124. Batch mode images or selected real time images may be stored in a host database on disc storage 138 or on a remote server (not shown). When the images have been reconstructed and transferred to storage, the image processor 152 may notify the operator workstation 102, i.e., a user. The operator workstation 102 may be used by an operator to archive the images, generate films, or send the images via a network to other facilities.

The MRI apparatus 100 may include one or more networked workstations 142. For example, a networked workstation 142 may include a display 144, one or more input devices 146, such as a keyboard and mouse, and a processor 148. The networked workstation 142 may be located within the same facility as the operator workstation 102, or in a different facility, for example, a different healthcare institution or clinic.

The networked workstation 142 may gain remote access to the data processor 114, image processor 152, and/or data storage server 116 via the communication apparatus 117. In this manner, magnetic resonance data, reconstructed images, or other data may be exchanged with the networked workstations 142, such that the data or images may be remotely processed by a networked workstation 142. The data may be exchanged in any suitable format, in accordance with the transmission control protocol (TCP), the Internet protocol (IP), or other known or suitable protocols.

As described in detail below, an exemplary embodiment provides methods and apparatuses for free-breathing multi-slice T1 mapping with volumetric LV coverage by interleaving the data acquired from different slices during the magnetization recovery of adjacent slices. For example, a slice-interleaved T1 (STONE) pulse sequence provides a free-breathing multi-slice inversion recovery based T1 mapping with volumetric LV coverage.

Figure 2:
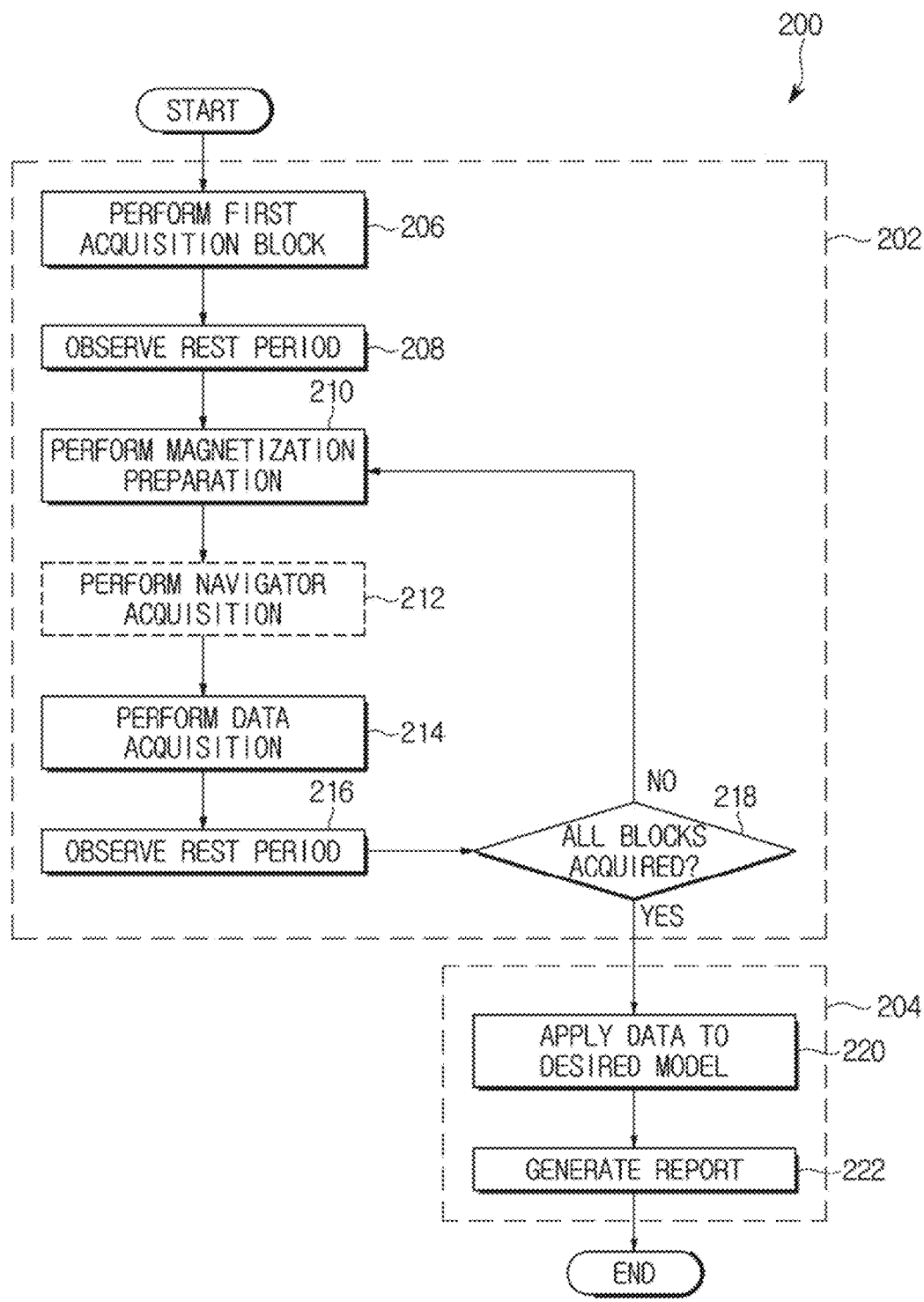
FIG. 2 is a flow chart of a method according to an exemplary embodiment.
Figure 3A:
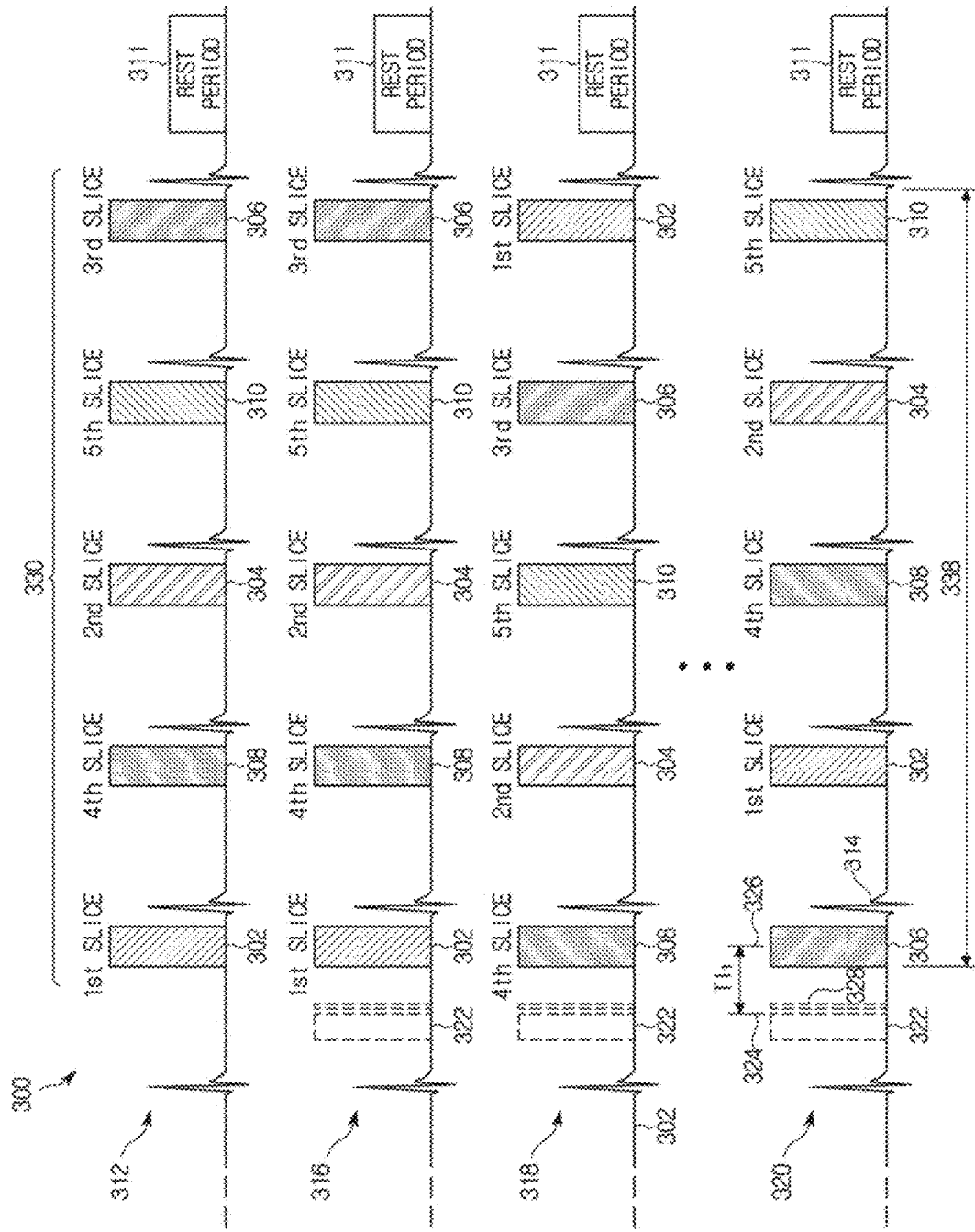
FIG. 3A is a schematic diagram of a pulse sequence according to an exemplary embodiment.
Figure 3B:
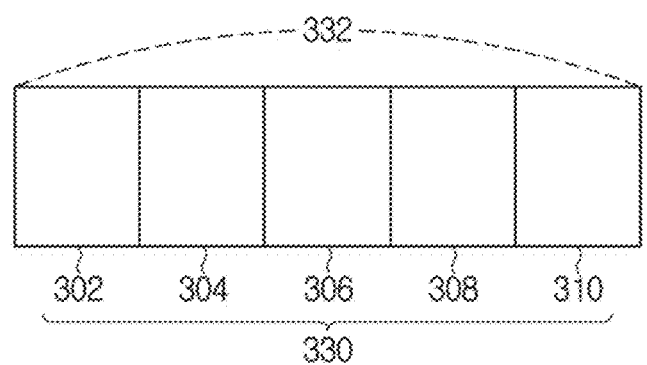
FIG. 3B is a schematic diagram of a region of interest (ROI) of a subject.

FIG. 2 illustrates a flow chart of a method 200 for performing free-breathing multi-slice T1 mapping with volumetric LV coverage in accordance with an exemplary embodiment. FIGS. 3A and 3B illustrate an example of one configuration for implementing the STONE pulse sequence 300.

Referring to FIG. 2, the method 200 may be divided into two sub-methods of a data acquisition 202 and an image reconstruction 204. The data acquisition sub-method 202 may be performed using the STONE pulse sequence 300, as illustrated in FIG. 3A.

In the illustrated non-limiting example of an exemplary embodiment of FIG. 3A, the data processor 114 may control so that the data acquisition for T1 measurements may be performed for a total of five single-shot image acquisitions for five different slices 302, 304, 306, 308, and 310, e.g., a first slice, a second slice, a third slice, a fourth slice, and a fifth slice, respectively. However, a number of slices is not limiting.

Referring to FIG. 3B, the data processor 114 may control data acquisition for a plurality of slices 330, for example, five slices 302, 304, 306, 308, and 310, which are located at different spatial locations across an ROI 332 of a subject or a portion of the ROI of the subject. One data acquisition of each of the slices 330 proceeds in turn, after a single magnetization preparation, during the magnetization recovery of the adjacent slices, as described in detail below. Although the slices 302, 304, 306, 308, and 310 are illustrated as slices disposed at five consecutive locations in the ROI 332, the slices may be located discontinuously, e.g., with a physical gap between each pair of adjacent slices. Also, an exemplary embodiment may be applied to slabs, segments, etc.

With reference again to FIG. 3A, during a first data acquisition block 312 of the pulse sequence 300, an image acquisition with no magnetization preparation is performed to acquire the imaging data from each of the first slice 302, the fourth slice 308, the second slice 304, the fifth slice 310, and the third slice 306 during the fully recovered longitudinal magnetization, for example, 90% or more. However, this is not limiting. As illustrated, the slices are not acquired in an anatomically-arranged order of slices.

The data acquisition for each slice 302, 304, 306, 308, and 310 may be triggered based on an ECG signal 314, for example, with a time delay.

The magnetization preparation module, for example, an inversion pulse 322, is executed at the beginning of each of second and third to Nth data acquisition blocks 316 and 318 through 320. The inversion pulse 322 may be a single non-selective inversion pulse, for example, an adiabatic RF pulse, with an inversion time (TI) of TI1. The inversion time TI1 may be defined as the time between an end 324 of the inversion pulse 322 and a time when the center 326 of k-space of a first-ordered slice is acquired, i.e., during the data acquisition of the slice subsequent to the inversion pulse 322, e.g., the third slice 306 in the Nth data acquisition block 320, as shown in FIG. 3A.

For example, to further facilitate coverage of all five slices and sufficient recovery time, the image acquisition may be performed during free breathing. To reduce through-plane motion, prospective slice tracking may be employed using, for example, a pencil beam navigator positioned on the dome of the right hemi-diaphragm. For example, a spatially selective re-inversion at the navigator position 328 may optionally be performed directly after each inversion pulse 322, to provide a constant navigator signal across all inversion times. Pencil beam navigator techniques are known to those skilled in the art, and, thus, a detailed description is omitted.

As illustrated in FIG. 3A, the first to Nth data acquisition blocks 312 through 320 are performed followed by a rest period 311. Thus, one image acquisition for each of the different slices 302, 304, 306, 308, and 310 may be executed during each data acquisition block, followed by a rest period 311, to allow for a magnetization recovery. For example, the rest period 311 may be less than five seconds and may be three seconds or less. This is in contrast to traditional inversion recovery (IR) based processes, as for example, MOLLI, because, in an exemplary embodiment, the recovery periods 338 between the consecutive inversion pulses 322 are used for slice-selective imaging of slices located at different locations. That is, the time following the acquisition of the first slice 302 in a second data acquisition block 316 is used to acquire second through fifth slices 304, 306, 308, and 310. As described in detail below with respect to FIG. 4, this allows for sampling of an undisturbed magnetization recovery curve without the need for extensive rest periods.

Data acquisition of each slice 302, 304, 306, 308, and 310 may be performed using slice-selective excitation of a tissue of one slice and a single-shot acquisition to ensure undisturbed longitudinal magnetization in the subsequent single-shot acquisitions at different locations of the slices. The acquisition order of the slices 302, 304, 306, 308, and 310 after the inversion pulses may be cycled and each slice may be excited only once between the inversion pulses. In an exemplary embodiment, each of the second and third to Nth data acquisition blocks 316 and 318 through 320 includes an inversion pulse 322 and the data acquisition of five imaging slices and may be repeated, for example, five times using the same inversion time TI1, but with a different slice order. Thus, in the illustrated example, this results in the acquisition of different inversion times per slice of TI1, TI1+RR, TI1+2RR, TI1+3RR, and TI1+4RR (where RR denotes the duration of one heart-beat) along the longitudinal recovery curve for each slice, i.e., between two inversion pulses.

For example, in the second data acquisition block 316, the imaging data of the first slice 302 is acquired at TI1, the imaging data of the fourth slice 308 is acquired at TI1+RR, the imaging data of the second slice 304 is acquired at TI1+2RR, the imaging data of the fifth slice 310 is acquired at TI1+3RR, and the imaging data of the third slice 306 is acquired at TI1+4RR. In the third data acquisition block 318, the imaging data of the first slice 302 is acquired at TI1+4RR, the imaging data of the fourth slice 308 is acquired at TI1, the imaging data of the second slice 304 is acquired at TI1+RR, the imaging data of the fifth slice 310 is acquired at TI1+2RR, and the imaging data of the third slice 306 is acquired at TI1+3RR. In the Nth data acquisition block 320, the imaging data of the first slice 302 is acquired at TI1+RR, the imaging data of the fourth slice 308 is acquired at TI1+2RR, the imaging data of the second slice 304 is acquired at TI1+3RR, the imaging data of the fifth slice 310 is acquired at TI1+4RR, and the imaging data of the third slice 306 is acquired at TI1.

Subsequently, the initial inversion time TI1 may be changed and a similar data acquisition may be repeated with the differently selected inversion time TI2. In this non-limiting example, the data acquisition may be completed for each slice with eleven T1-weighted images acquired along the recovery curve sampled at ∞, TI1, TI1+1RR, TI1+2RR, TI1+3RR, TI1+4RR, TI2, TI2+1RR, TI2+2RR, TI2+3RR, and TI2+4RR. Within this non-limiting example, the typical scan time to cover, for example, five slices is about 1:35 minutes for a heart-rate of 60 beats per minute.

Referring again to FIG. 2, a first data acquisition block 312 may be executed in operation 206.

In operation 208, a rest period 311 may be observed to allow for a full magnetization recovery.

In operation 210, the magnetization preparation module, e.g., the inversion pulse 322, is executed, at the beginning of one of the second and third to Nth data acquisition blocks 316 and 318 through 320.

In operation 212, a spatially selective re-inversion at the navigator position 328 may optionally be performed directly after each inversion pulse 322.

In operation 214, data acquisition is performed in one of the subsequent second and third to Nth data acquisition blocks 316 and 318 through 320.

In operation 216, the rest period 311 is performed at the end of each of the second and third to Nth data acquisition blocks 316 and 318 through 320, i.e., after the data acquisition of the last-ordered slice.

As shown in FIG. 3A, the last-ordered slice may be the third slice 306, the first slice 302, and the fifth slice 310 of each second, third, and Nth data acquisition blocks 316, 318, and 320, respectively.

In operation 218, it is determined whether all of the second and third to Nth data acquisition blocks 316 and 318 through 320 have been acquired and, if not, the process returns to operation 210 and a subsequent data acquisition block is acquired in operations 210 through 214.

For each data acquisition block, to further control residual cross-talk, acquisition of the slices 302, 304, 306, 308, and 310 may be performed in a specific order after the inversion pulse 322. For example, the acquisition ordering of the slices 302, 304, 306, 308, and 310 may be selected to maximize the space between two consecutive slices 302, 304, 306, 308, and 310. Additionally, in-plane motion compensation may be achieved using retrospective image registration based on a non-rigid image registration algorithm for myocardial T1 mapping, such as described, for example, in an article entitled "Improved motion correction for T1 mapping" by Roujol S, Foppa M, Kawaji K, Kissinger K V, Goddu B, Manning W J, Nezafat R, Journal of Cardiovascular Magnetic Resonance (2014; 16:P45), which is incorporated herein by reference in its entirety. This algorithm simultaneously estimates a non-rigid motion field and intensity variations, and uses an additional regularization term to constrain the deformation field using automatic feature tracking.

Figure 4:
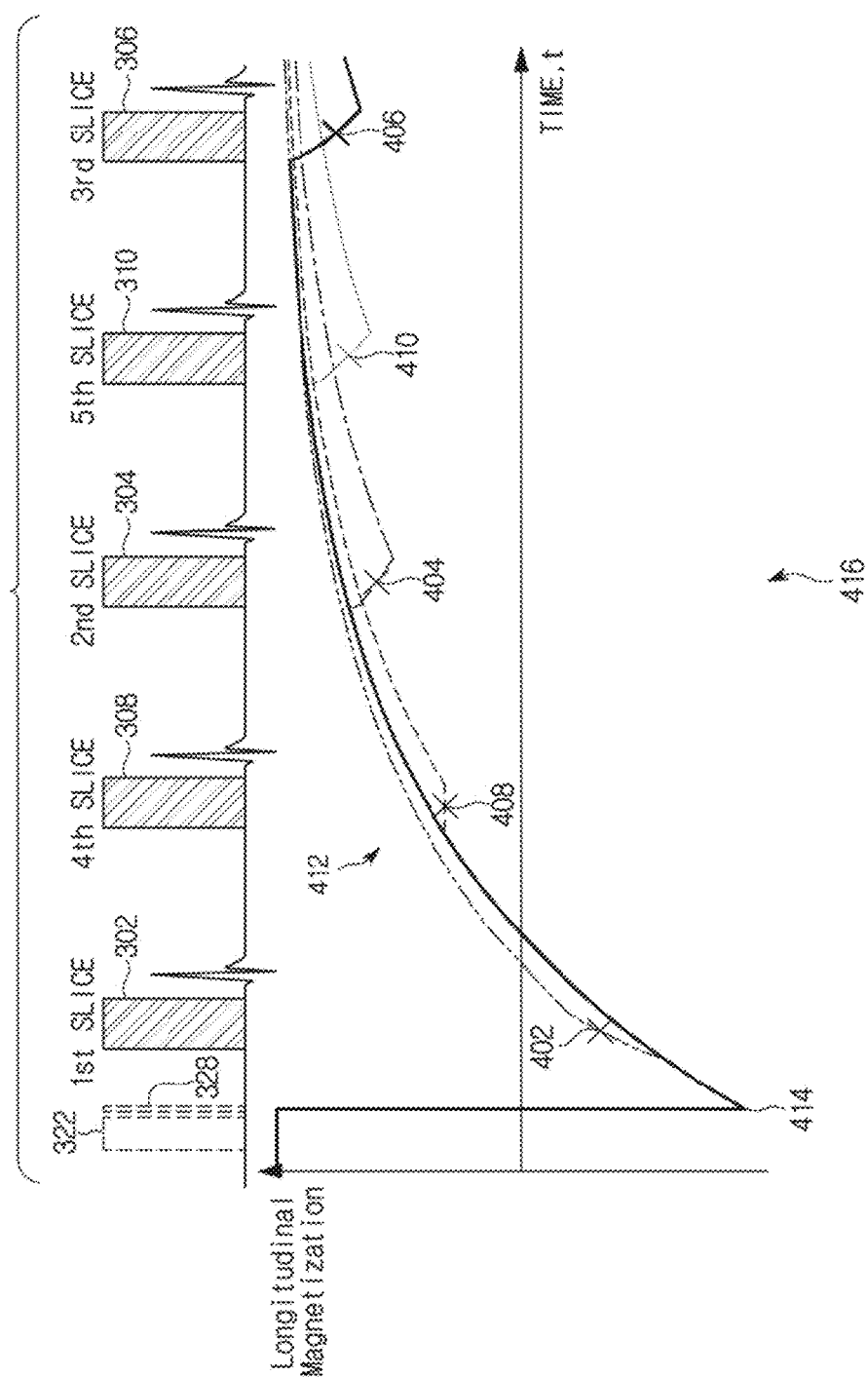
FIG. 4 is a schematic diagram of a data acquisition block of a pulse sequence according to an exemplary embodiment.

FIG. 4 is a schematic illustration of the longitudinal magnetization recovery in five different slices on a graph 416. In the graph 416, the crosses 402, 404, 406, 408, and 410 indicate the acquisition time of the k-space centers of corresponding slices 302, 304, 306, 308, and 310. As illustrated in the longitudinal magnetization recovery curve 412, magnetization in all slices 302, 304, 306, 308, and 310 is inverted (reference numeral 414) with the non-selective inversion pulse 322 and recovers over the time t. By using selective excitation for the acquisition of each slice 302, 304, 306, 308, and 310, each subsequent slice acquisition only perturbs the magnetization in a single-slice, while the other slices remain unperturbed. Thus, as described above, sampling of an undisturbed magnetization recovery curve for different slices is achieved without the need for extensive rest periods, resulting in a scan time of, for example, less than 20 seconds per slice, while not requiring a correction for the disturbance of the imaging pulses of a repeated imaging data read-out.

The data acquisition sub-method 202 may be performed using the above-described slice-interleaved T1 (STONE) sequence that acquires multiple sets of single-shot images of different slices 330, acquired after a single non-selective inversion pulse. Each slice is only selectively excited once after each inversion pulse to allow sampling of the unperturbed longitudinal magnetization in the adjacent slices. For a respiratory motion, a prospective slice-tracking respiratory navigator may be used to decrease through-plane motion followed by a retrospective image registration to reduce in-plane motion.

Referring again to FIG. 2, the reconstruction sub-method 204 may be performed following the data acquisition sub-method 202. In operation 220, the acquired data is applied to a desired model which may be selected based on various criteria, tradeoffs and/or consideration. In accordance with an exemplary embodiment, T1 maps may be generated using voxel-wise curve-fitting of the inversion recovery signal model to the image intensities. As described in detail below, two different models to generate T1 maps may be used and are described as an example only. However, this is not limiting and other appropriate models may be used by the data processor 114 and/or image processor 152, in operation 220.

For example, a two-parameter fit model for the inversion recovery signal ($S_{2p}$) may be represented as:

$$S_{2p}(t) = M_0(1 - 2e^{-t/T_1})  \quad \text{Equation 3;}$$

where S is a signal intensity,
t is an inversion time,
$M_0$ is the signal with full longitudinal magnetization recovery, and
$T_1$ is the longitudinal relaxation time.

The model assumes perfect inversion pulse efficiency and no disturbance of magnetization due to imaging pulses prior to the acquisition of the central k-space line.

As another example, a three-parameter fit model for the inversion recovery signal ($S_{3p}$) may be used as follows:

$$S_{3p}(t) = M_0(1 - Be^{-t/T_1}) \quad \text{Equation 4;}$$

where the additional parameter B is a variable that models apparent inversion efficiency, and may be used to correct for imperfect inversion pulses.

As shown in FIG. 4, the longitudinal magnetization recovery curve 412 is only perturbed by one set of imaging pulses after the inversion, as illustrated by the changes in magnetization that include the crosses 402, 404, 406, 408, and 410. Thus, in an exemplary embodiment, no correction for the disturbance caused by the repeated imaging is needed. This further distinguishes pulse sequences of an exemplary embodiment from, for example, the MOLLI pulse sequence, which needs correction for the recovery curve disturbances caused by multiple RF excitation pulses, i.e., by the repeated imaging.

Referring again to FIG. 2, after the desired model is selected and used in operation 220, a report may be generated that, for example, includes a T1 map created using the acquired data, in operation 222.

As described above, the data may be acquired during a free-breathing multi-slice T1 mapping acquisition with volumetric LV coverage by interleaving data acquisition of different slices 330 during the recovery time of adjacent slices, by using the slice-interleaved T1 (STONE) pulse sequence. The report, thus, provides T1 mapping that may be referred to as "STONE T1 maps" that may be calculated using at least one of a two-parameter fit model and a three-parameter fit model.

The accuracy and precision of the STONE pulse sequence and the resulting different T1, T2, and inversion pulse efficiency were studied and, as described below, are superior to the related art systems and methods.

Numerical Simulations

Numerical simulations were performed to study the accuracy and precision of the above-described STONE pulse sequence for different combinations of T1 and T2 times. To simulate the impact of an imperfect RF inversion pulse on the accuracy and precision, the estimated T1 was also calculated by varying the effective inversion flip angle. For comparison, the MOLLI pulse sequence with the 5-(3s)-3 scheme was simulated. The Bloch equations were used to simulate the longitudinal and transverse magnetization curves for all sequences. T1 times were generated from the simulated transverse magnetization at the echo time of the central k-space line using a two- and three-parameter fit model for the STONE sequence, and a three-parameter fit model with flip-angle correction for the data associated with the MOLLI pulse sequence.

The simulated sequences shared the following imaging parameters: balanced steady-state free precession (bSSFP) imaging readout, TR/TE/$\alpha$=2.9 ms/1.54 ms/35°, total phase-encoding lines=70, linear k-space ordering, 10 linear sweep-up start-up pulses, heart rate=60 bpm. The resulting inversion times for the STONE sequence were: ∞, 135, 1135, 2135, 3135, 4135, 350, 1350, 2350, 3350, 4350, and for the 5-(3s)-3 MOLLI: 135, 1135, 2135, 3135, 4135, 350, 1350, 2350.

Two sets of simulations were performed. In the first set, with reference to FIGS. 5A and 6A, the T1 was varied between 400 and 1500 ms in steps of 100 ms, the T2 time was varied between 35 and 65 ms in steps of 5 ms, and the effective inversion flip-angle was kept constant as 180 degree. In the second set of simulations, with reference to FIGS. 5B and 6B, the T2 time was fixed to 50 ms, the T1 time was varied between 400 and 1500 ms in steps of 100 ms, and the effective inversion flip-angle was varied from 150 degrees to 180 degrees in steps of 5 degrees. Each simulation was performed 20,000 times with random Rician noise, corresponding to a signal-to-noise ratio (SNR) of 50 in the image with no magnetization preparation.

Figure 5A:
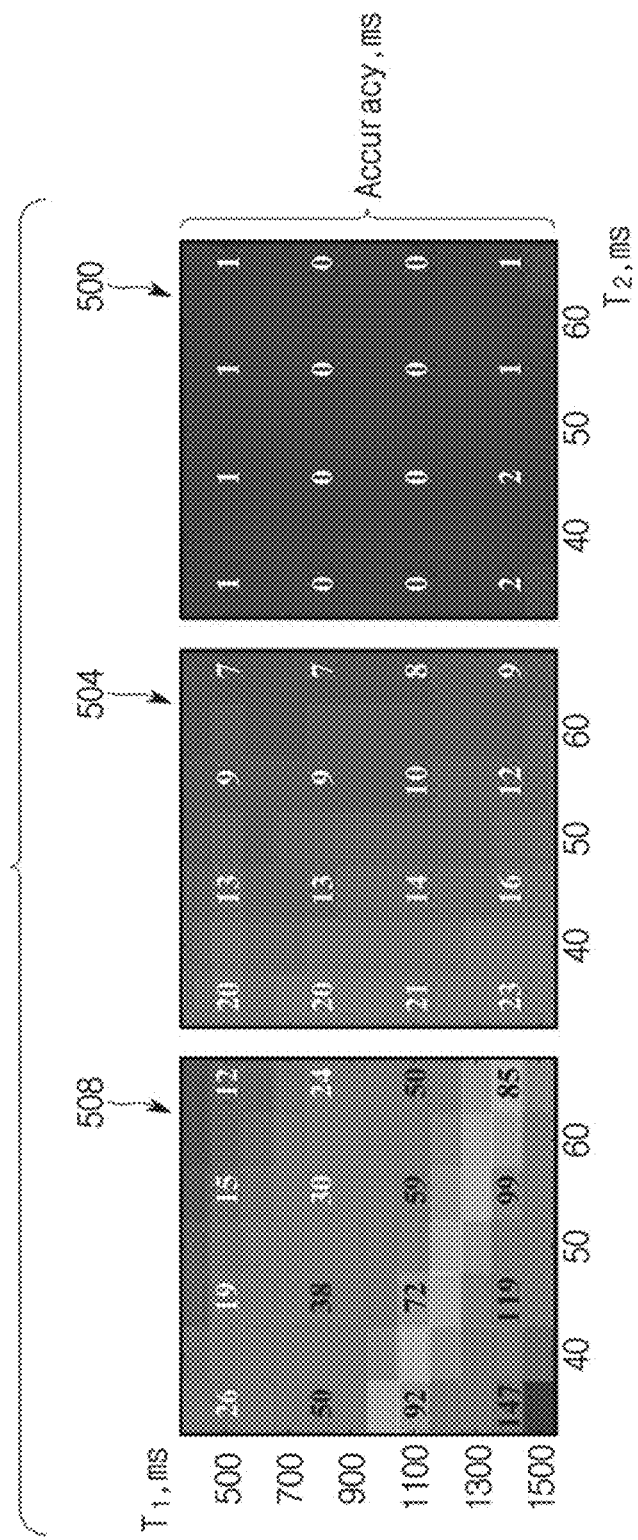
FIGS. 5A and 5B are comparable graphical illustrations of numerical simulations for the accuracy of T1 sequences.
Figure 5B:
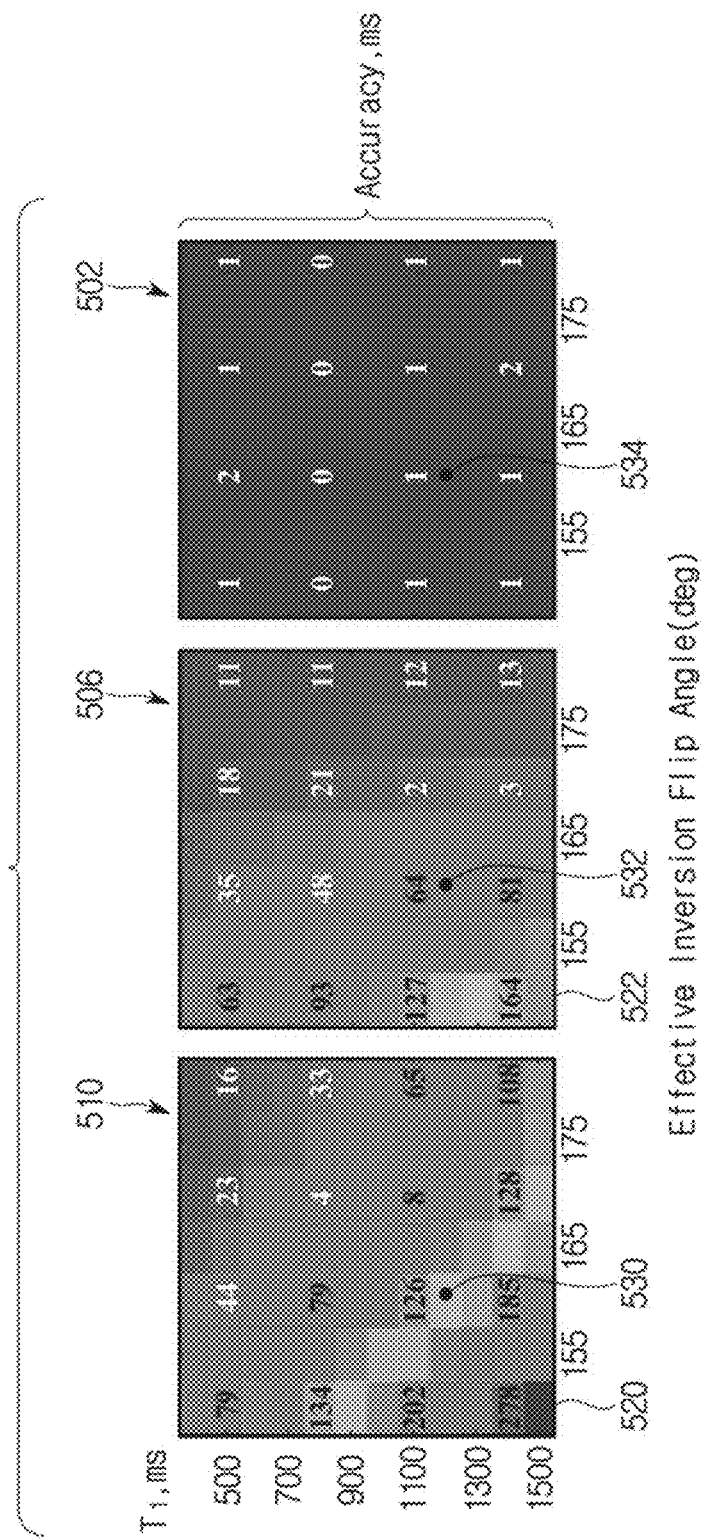

FIGS. 5A and 5B show the accuracy of the MOLLI sequence, the STONE sequence using the two-parameter fit model, and the STONE sequence using three-parameter fit model. FIG. 5A shows the results of numerical simulations that were performed for calculating the accuracy with varying T1 and T2 times assuming perfect inversion-efficiency, and FIG. 5B shows the results of numerical simulations with varying T1 times and inversion efficiency and constant T2 of 50 ms. The accuracy (ms) was defined as the difference between the simulated T1 times and the mean of all estimated T1 times for one set of parameters.

As shown in FIGS. 5A and 5B, the STONE pulse sequence with a three-parameter fit results in the highest accuracy (graphical representations 500 and 502). The STONE pulse sequence with a two-parameter fit model (graphical representations 504 and 506) was more accurate than MOLLI pulse sequence (graphical representations 508 and 510).

As shown in the left-bottom quadrants of graphical representations 504, 506, 508, and 510, the deviation from the true T1 time with MOLLI pulse sequence and the STONE pulse sequence with a two-parameter fit increased with longer T1 times, shorter T2 times and reduced inversion efficiency, resulting in an underestimation of up to 306 ms for the MOLLI pulse sequence (reference numeral 520 in FIG. 5B) and 176 ms for the STONE pulse sequence with two-parameter fit (reference numeral 522 in FIG. 5B).

As shown in the graphical representations 500 and 502, the STONE pulse sequence with a three-parameter fit maintained low deviations for all simulated ranges of T1, T2 and effective inversion flip-angle (<2 ms).

With reference to FIG. 5B, the accuracy for the parameters that can be expected for in-vivo assessment of native T1 times, i.e., T1≈1200 ms, T2≈50 ms, and effective inversion flip-angle≈160 degree, was 145 ms for the MOLLI pulse sequence (reference numeral 530), 70 ms for the STONE pulse sequence with two-parameter fit (reference numeral 532), and 1 ms for the STONE pulse sequence using a three-parameter fit (reference numeral 534).

Figure 6A:
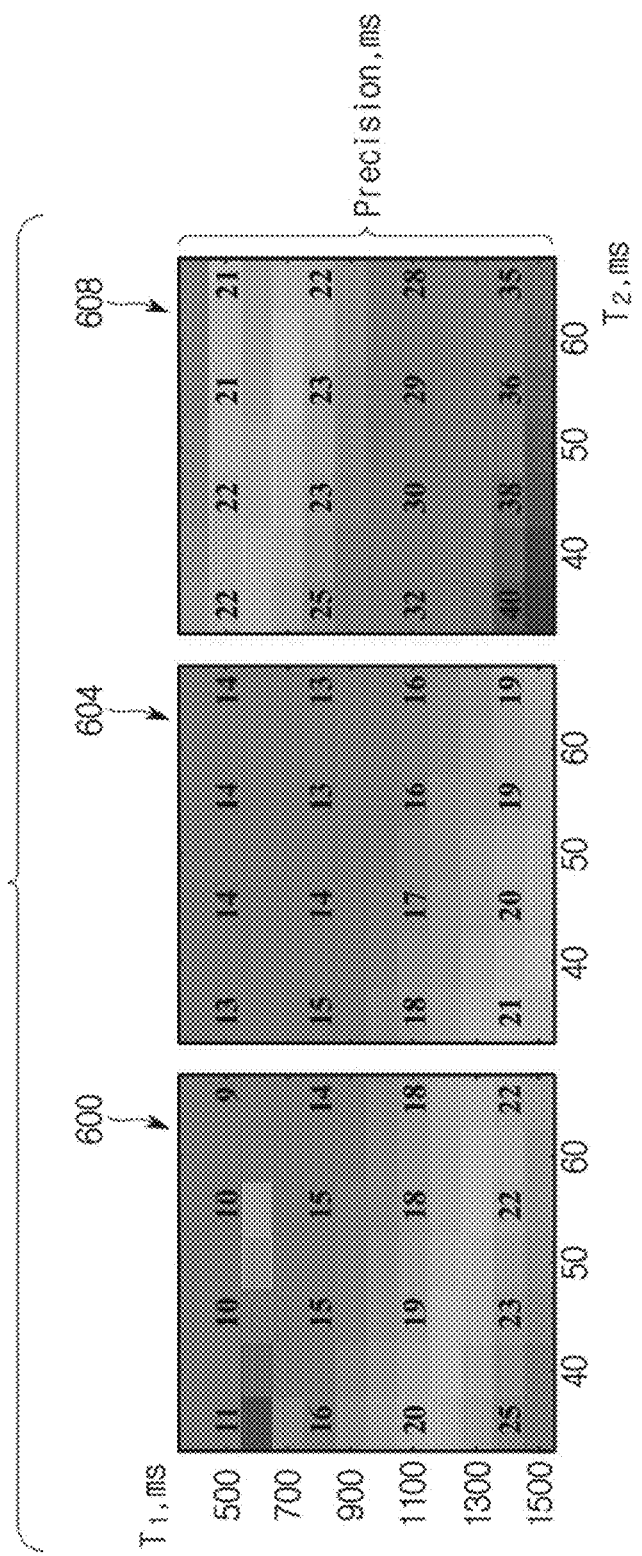
FIGS. 6A and 6B are comparable graphical illustrations of numerical simulations for the precision of T1 sequences.
Figure 6B:
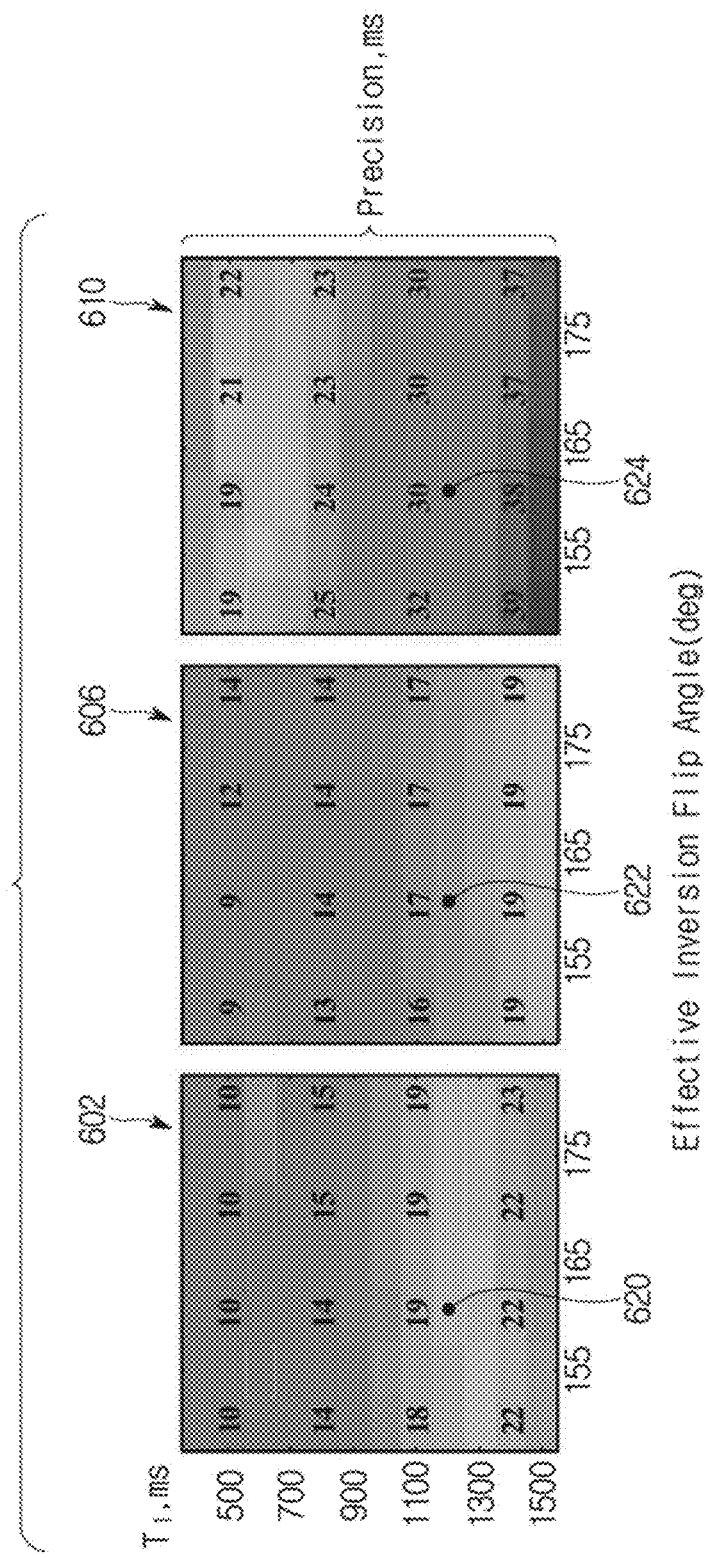

FIGS. 6A and 6B show the precision of the MOLLI sequence (graphical representations 600 and 602), the STONE sequence using the two-parameter fit model (graphical representations 604 and 606), and the STONE sequence using three-parameter fit model (graphical representations 608 and 610). FIG. 6A shows the results of numerical simulations that were performed for calculating the precision with varying T1 and T2 times assuming perfect inversion-efficiency, and FIG. 6B shows the results of numerical simulations with varying T1 times and inversion efficiency with constant T2 of 50 ms. The precision (ms) was assessed as the standard deviation over all estimated T1 times for one set of parameters.

As shown in the graphical representations 600, 602, 604, 606, 608, and 610, the precision of all methods decreased with longer T1 times and shorter T2 times. However, only small variations for different inversion efficiencies can be observed. The MOLLI pulse sequence (graphical representations 600, 602) and the STONE method with a two-parameter fit (graphical representations 604, 606) show better precision as compared to the STONE pulse sequence with a three-parameter fit (graphical representations 606, 610).

With reference to FIG. 6B, the standard deviation of the estimated T1 time for expected native in-vivo parameters, i.e., T1≈1200 ms, T2≈50 ms, and effective inversion flip-angle≈160 degrees, was 20 ms with the MOLLI pulse sequence (reference numeral 620), 17 ms for the STONE pulse sequence using a two-parameter fit (reference numeral 622), and 33 ms with the STONE pulse sequence using a three-parameter fit (reference numeral 624).

Phantom Imaging

A phantom study was performed to characterize the accuracy and precision of the estimated T1 times. The phantom included 9 vials containing $NiCl_2$-doped agarose-gel, with varying concentration resulting in T1 times between 400 and 1600 ms, and T2 times between 50 and 200 ms. In addition to the STONE pulse sequence, T1 maps using 5-(3s)-3 MOLLI were acquired. A bSSFP imaging readout with the following sequence parameters was used for imaging: in-plane resolution=2.1×2.1 $mm^2$, slice thickness=8 mm, FOV=360×356 $mm^2$, TR/TE/$\alpha$=2.9 ms/1.54 ms/35 degrees, SENSE rate=2, number of phase encoding lines=78, linear k-space ordering, 10 linear sweep up pulses. An ECG signal was simulated with 60 bpm. Ten repetitions of each sequence were performed. The slice-gap in the STONE T1 maps was 8 mm. For all three sequences, a slice-selective Sinc-Gauss RF excitation pulse with duration of 0.43 ms was used for imaging and an adiabatic hyperbolic-secant inversion pulse with 11 ms pulse-duration for magnetization preparation was used. The MOLLI pulse sequence was performed with the acquisition of only one slice, aligned to the central slice of the STONE pulse sequence. All DICOM images were exported and used for estimating the voxel-wise T1 maps. The STONE T1 maps were calculated using both two- and three-parameter fit models. The MOLLI T1 maps were generated by fitting a three-parameter fit model with additional correction for the disturbance from the repeated imaging pulses.

An inversion recovery spin-echo sequence (IR-SE) was used to measure reference T1 values for each vial. Fifteen 2D IR-SE images were acquired using 15 different inversion times between 50 and 5000 ms with the following imaging parameters: in-plane spatial resolution=1.3×1.3 mm$^2$, slice-thickness=8 mm, FOV=120×120 mm$^2$, TR/TE/α=10 s/10 ms/90 degrees, and scan time=3:20 hours. Voxel-wise T1 times were calculated off-line by fitting a three-parameter fit model to the 15 IR-SE images.

For each method, the average T1 time for each vial was measured as the average over a manually drawn region of interest (ROI) averaged over all repetitions. The accuracy was defined as the difference between the average T1 time and the IR-SE T1. Precision was defined as the standard deviation of the estimated T1 times in the ROI of all repetitions.

In-Vivo Imaging

Seven healthy adult subjects volunteered. Additionally, seven patients were referred for clinical cardiac MR with the following indications: left ventricular hypertrophy, pericardial cyst, coronary artery disease, aortic valve disease, pulmonary hypertension, cardiac sarcoidosis and palpitations. Each subject was imaged using two sequences: the STONE pulse sequence with five slices and the 5-(3s)-3 MOLLI pulse sequence with three slices acquired in three separate breath-holds. Both sequences were performed using a bSSFP read-out and the following parameters: in-plane resolution=2.1×2.1 mm$^2$, slice-thickness=8 mm, FOV=360× 352 mm$^2$, TR/TE/α=2.6 ms/1.0 ms/35 degrees, SENSE-rate=2, number of phase encoding lines=78, linear ordering, 10 linear ramp-up start-up pulses. Five short-axis slices with 8 mm slice-gap were acquired with the STONE pulse sequence, using a fixed respiratory navigator slice tracking factor of 0.6. Three slices, aligned to the central three slices of the STONE pulse sequence, were acquired with MOLLI pulse sequence.

T1 maps from the STONE pulse sequence were generated using both two- and three-parameter fit models. The MOLLI T1 maps were generated with a three-parameter fit model and retrospective correction for the magnetization perturbation of the imaging pulses.

T1 Measurements

An ROI was manually drawn in the septum for each method and each slice.

All three slices were analyzed for the data acquired using the MOLLI pulse sequence and only the corresponding central three slices were analyzed for the STONE T1 maps. The average T1 time for a patient was assessed as the average T1 within an ROI averaged over all slices. The mean of the standard deviation of the myocardial T1 times within each ROI averaged over all slices was also calculated for each subject. T1 times are also presented in an AHA 16 segment model. Manually drawn epi- and endocardial contours in the central three slices were used to segment the myocardium with reference to the insertion point of the right ventricle.

Statistical Analysis

The average T1 time and the mean standard deviation within the myocardium of the three methods were statistically compared using a paired Student's T-test. A P-value of <0.05 was considered to be statistically significant. Furthermore, for the STONE method, the average T1 times were analyzed across the slices. The hypothesis of no statistical significant difference in the T1 time between different slices was tested using a paired Student's T-test, with Bonferroni-correction, leading to statistical significance for a P-value<0.017.

Figure 7A:
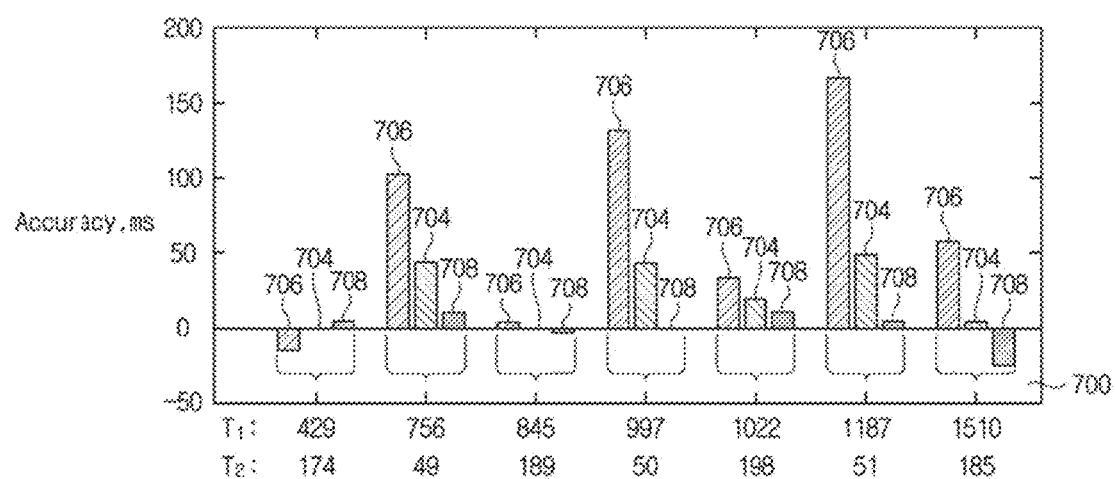
FIGS. 7A and 7B are graphs of T1 measurements in different phantom vials with different T1 and T2 times.
Figure 7B:
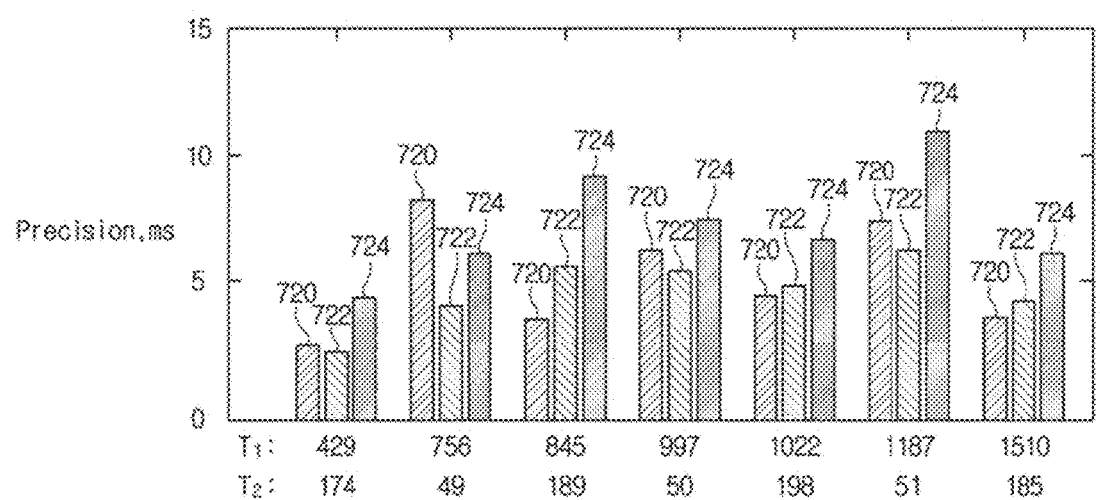

FIGS. 7A and 7B are graphs that, respectively, show the accuracy and precision of different T1 mapping sequences in phantom vial experiments, with different T1 and T2 times. Accuracy was defined as the difference between the average of all repetitions and a spin-echo inversion recovery reference T1 time. Precision was assessed as the standard deviation of the estimated T1 across the vial and across 10 repetitions. A lower portion 700 of the graph of FIG. 7A shows underestimation and an upper portion 702 shows overestimation.

As shown in FIG. 7A, the STONE pulse sequence with a two-parameter fit model (reference numeral 704) resulted in a substantially improved accuracy as compared to the MOLLI pulse sequence 706 (P<0.001). The deviation from the spin-echo sequence was decreased by an average of 52 ms (from 76±58 ms using MOLLI to 23±18 ms using STONE), which corresponded to an average relative accuracy improvement of 71%. The data acquired using the STONE pulse sequence and processed with a three-parameter fit model (reference numeral 708) resulted in even more accurate T1 times than the use of the two-parameter fit model (P<0.011).

As shown in FIG. 7B, the precision of data acquired using MOLLI pulse sequence 720 was similar to the STONE T1 maps with a two-parameter fit model (reference numeral 722; 4±2 ms vs. 4±1 ms, P=0.62), but better than three-parameter fit model (reference numeral 724; 7±2 ms, P<0.001).

Figure 8:
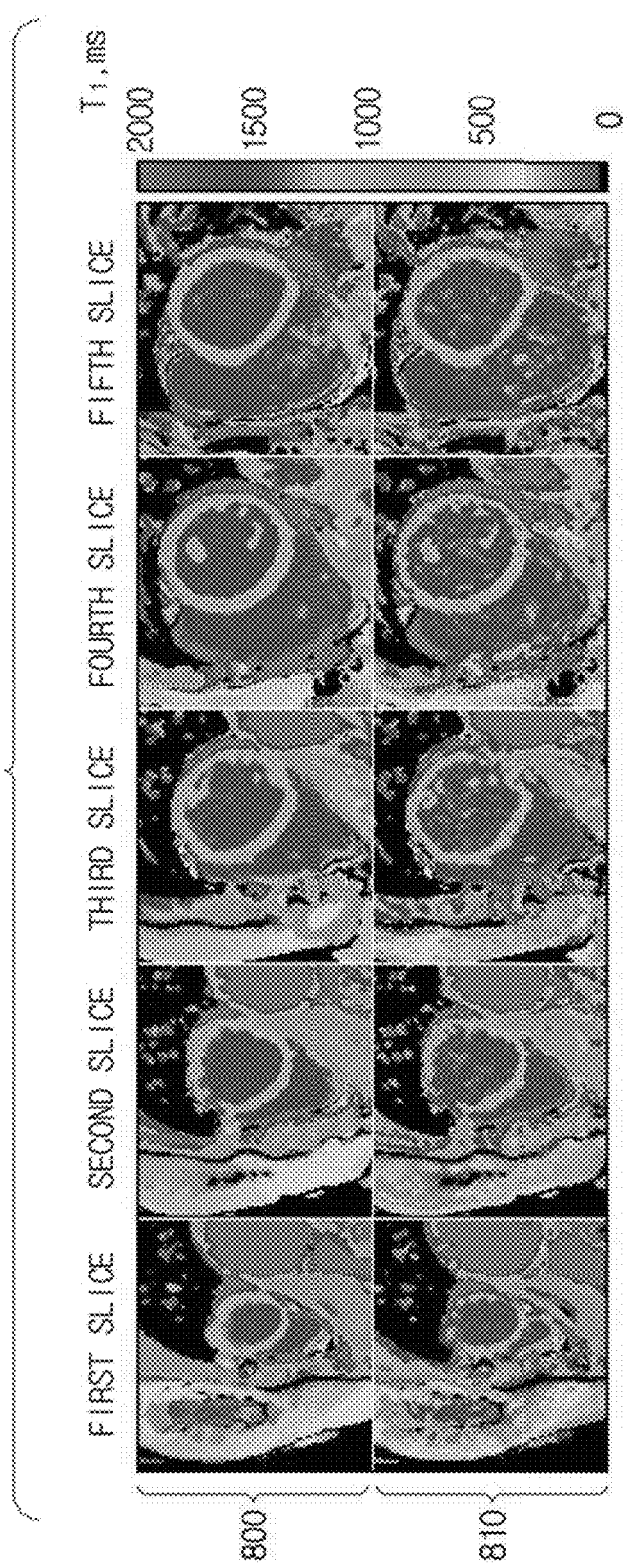
FIG. 8 is an example of a multi-slice native T1 maps acquired using the STONE sequence according to an exemplary embodiment.

FIG. 8 provides examples of T1 maps the T1 maps of five slices 302, 304, 306, 308, and 310 acquired from a healthy subject and reconstructed using the above-described process using STONE with a two-parameter fit model (maps 800) and a three-parameter fit model (maps 810). Visually improved T1 map quality may be observed in the maps 800 obtained with the two-parameter fit model. I.e., the maps 800 show less color variation across the myocardium, as compared to the maps 810.

Figure 9:
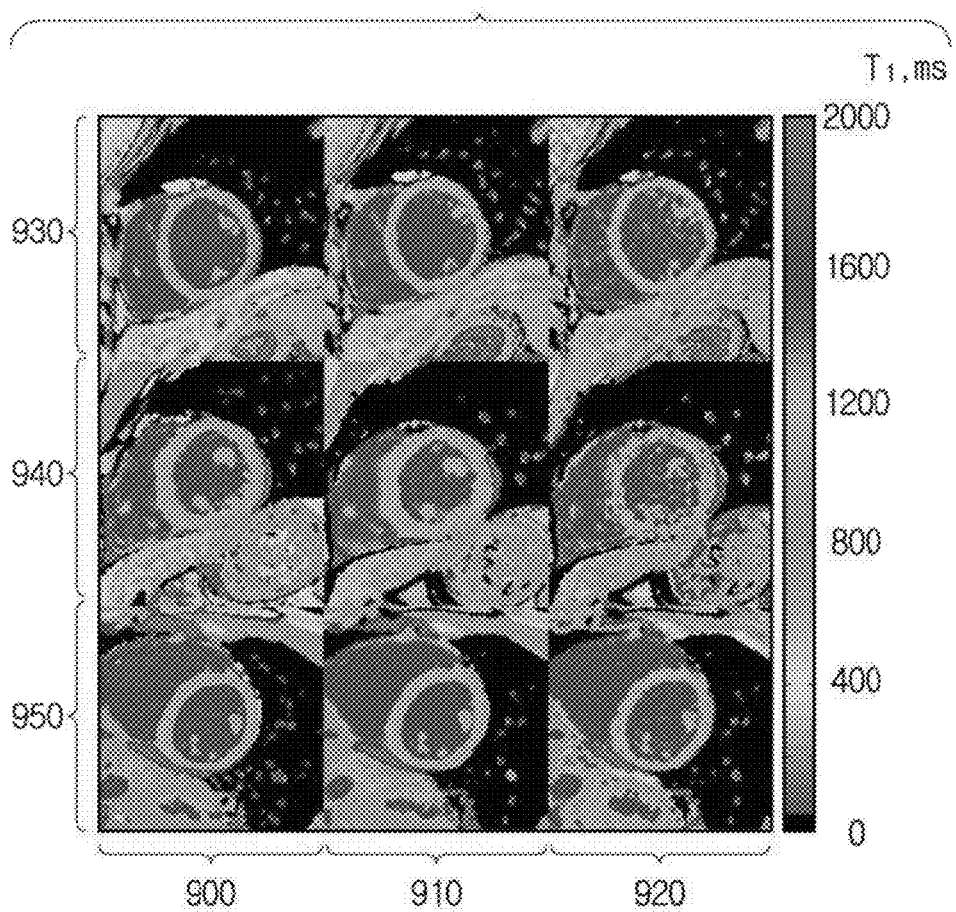
FIG. 9 is a comparable example of multi-slice native T1 maps acquired using the MOLLI sequence and the STONE sequence.

FIG. 9 shows representative T1 maps acquired with the MOLLI sequence (maps 900) and the STONE sequence via the two-parameter fit model (maps 910) and the three-parameter fit model (maps 920), in three different healthy subjects 930, 940, and 950. As shown, homogenous T1 maps 910 and 920, with visually low noise contamination were obtained with MOLLI, and with the STONE via a two-parameter fit model, respectively. However, the signal homogeneity is decreased in the maps 930, when using a three-parameter fit model with the STONE sequence.

As demonstrated by FIGS. 8 and 9, a quality of the color T1 maps reconstructed by using an exemplary STONE sequence with a two-parameter fit model is approximately the same as that of MOLLI which uses a three-parameter fit model to compensate for the recovery-curve disturbance caused by multiple RF excitations. Therefore, the exemplary STONE sequence may provide a multi-slice free-breathing MR image acquisition while maintaining the same color map quality as that of MOLLI.

Figure 10A:
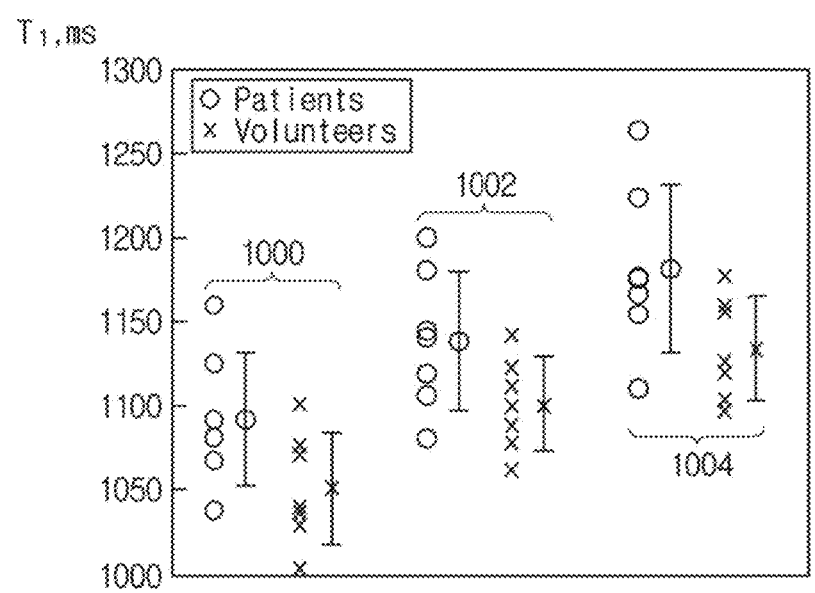
FIGS. 10A and 10B are graphs of mean and standard deviations.

FIG. 10A summarizes the in-vivo T1 times measured in seven healthy subjects and seven cardiac patients with the three T1 mapping methods, i.e., MOLLI (reference numeral 1000), STONE using the two-parameter fit (reference numeral 1002), and STONE sequence using the three-parameter fit (reference numeral 1004). As shown in FIG. 10A, MOLLI resulted in the lowest T1 times: 1051±33 ms for healthy subjects and 1092±39 ms for patients. In-vivo T1 times with the STONE sequence using the two-parameter fit model were longer for healthy subjects 1101±27 ms (p<0.01) and for patients 1139±42 ms (P<0.01). The T1 times assessed with the STONE sequence using the three-parameter fit model were the longest: 1134±30 ms for healthy subjects (P<0.001 vs. MOLLI, P<0.02 vs. two-parameter) and 1182±50 ms for patients (P<0.001 for both MOLLI and two-parameter). With all methods, patient subjects showed a tendency of elevated T1 times as compared to healthy subjects.

Figure 10B:
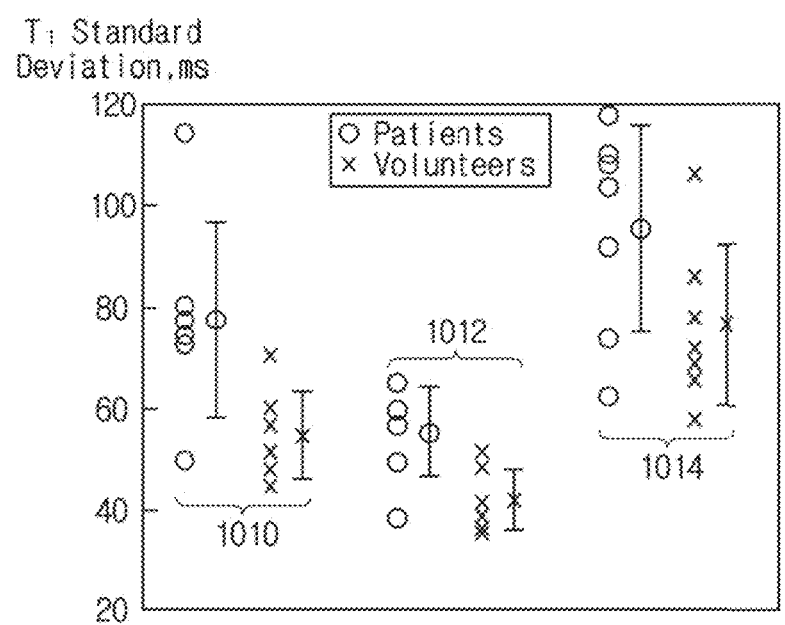

FIG. 10B shows the standard deviation of the T1 times within the septal ROI for all in-vivo subjects, for MOLLI pulse sequence (reference numeral 1010), STONE pulse sequence using the two-parameter fit (reference numeral 1012), and STONE pulse sequence using the three-parameter fit (reference numeral 1014). The lowest variations within the ROI were obtained using STONE with a two-parameter fit reconstruction: 41±6 ms for healthy subjects and 55±9 ms for patients (reference numeral 1012). These variations were increased to 54±9 ms for healthy subjects and 77±19 ms for patients using MOLLI (reference numeral 1010). STONE with a three-parameter fit model showed the highest variations of T1 times: 76±16 ms for healthy subjects, and 95±21 ms for patients, (reference numeral 1114).

Figure 11A:
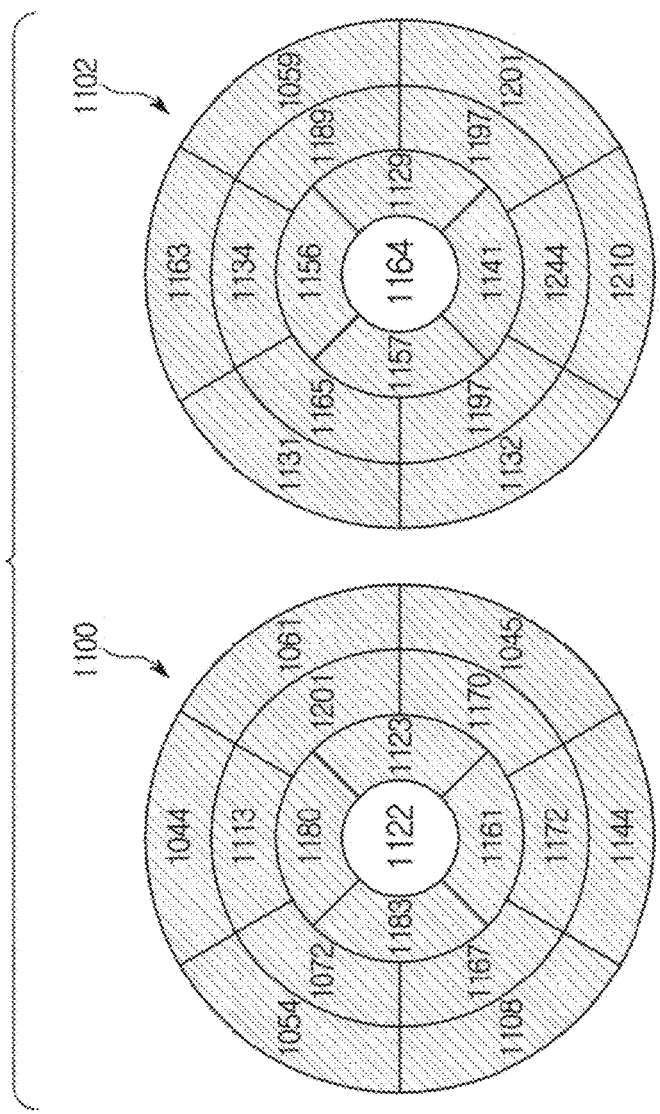
FIG. 11A is a circumferential polar plot of the T1 times according to American Heart Association (AHA) model.

FIG. 11A shows the circumferential polar plot representation of the T1 times in 16 myocardial segments according to AHA model of the healthy subject from FIG. 8, using the STONE sequence with a two-parameter fit (reference numeral 1100) and three-parameter fit (reference numeral 1102). The T1 value in the center indicates the average over the entire myocardium. Visually high homogeneity was observed across the segments and across the slices.

Figure 11B:
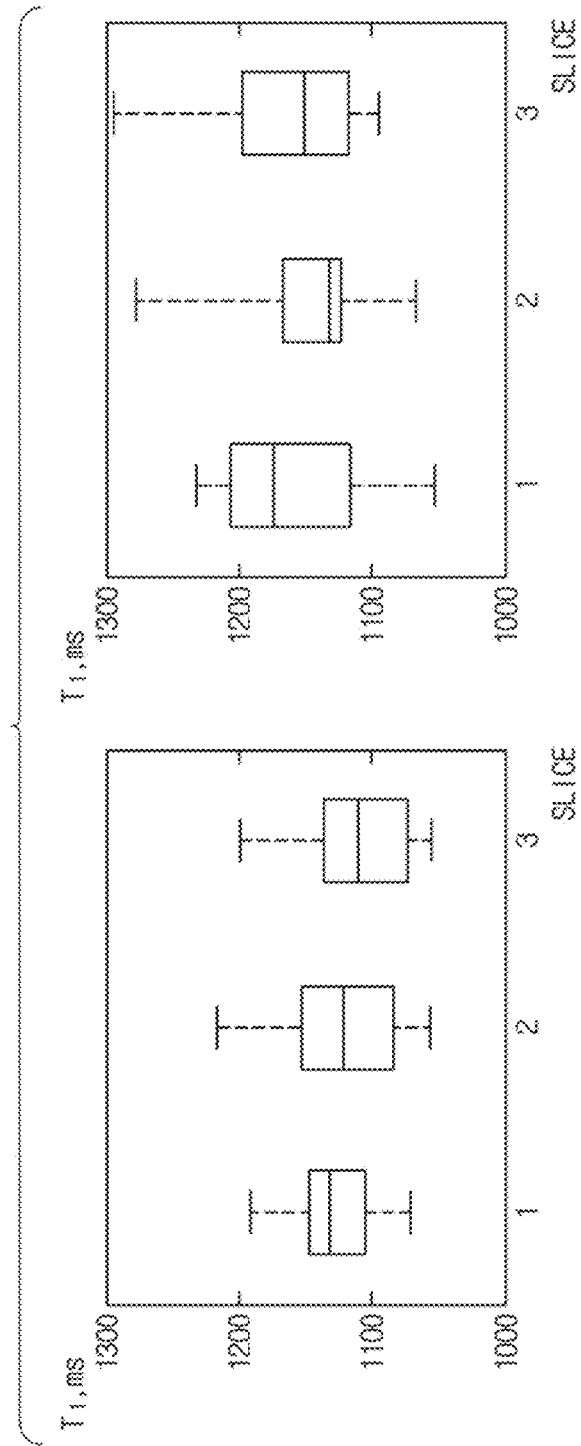
FIG. 11B is a plot of T1 times across the three slices measured using the STONE sequence.

FIG. 11B shows the T1 times across the central three slices obtained with the STONE sequence. The horizontal line in the middle of each box indicates the mean T1 time for each slice across all of the subjects, e.g., heathy subjects and patients. The boxes indicate the position of the 25th to 75th quartile, and the whiskers show the range of observed T1 times. The average T1 times across all subjects for each slice were: 1127±34 ms, 1122±48 ms, and 1111±48 ms, for a reconstruction with a two-parameter fit model and 1159±56 ms, 1148±57 ms, and 1163±59 ms, for a reconstruction with a three-parameter fit model. No statistical significant difference was found in the pair-wise comparison of the T1 times between slices.

As described above, the multi-slice T1 mapping sequence of an exemplary embodiment, i.e., STONE, provides more accurate T1 times as compared to the MOLLI sequence, and with similar precision. The MOLLI method samples the longitudinal magnetization recovery curve multiple times after a single magnetization preparation pulse, which hinders the accuracy. Unlike MOLLI, in an exemplary embodiment, the recovery periods between the inversion pulses are used for slice-selective imaging of other slices. This allows for sampling of an undisturbed magnetization recovery curve without the need for extensive rest periods, resulting in a scan time of less than 20 seconds per slice, while not requiring a correction for the disturbance of the imaging pulses of a repeated imaging read-out.

Residual disturbance of the longitudinal magnetization might be induced by the excitation in neighboring slices, due to imperfect slice-profiles, residual respiratory motion or cardiac motion. To control the through-plane motion, prospective slice tracking using a respiratory navigator may be performed and the slice ordering may be chosen to increase the distance between slices in successive heartbeats. In the non-limiting example, an 8 mm slice gap with 5 slices may be used to minimize the potential cross-talk effects. In the description above, the number and location of the sampling points on the T1 recovery curve was chosen to parallel that of a MOLLI sequence. Different number of sampling points or slices, allowing for increased slice-gap, may be achieved by a slight modification of the imaging sequence.

The SSFP startup pulses and acquisition of multiple k-space lines in the linear ordering disturb the longitudinal magnetization before the central k-space line is acquired. However, it has been shown that the effect of pulses in single-shot bSSFP imaging on the longitudinal magnetization may be modeled as an affine transformation. Hence, the accuracy is maintained if a three-parameter fit model is used. However, if a two-parameter fit model is used, these pulses induce dependence on the T2 time, the flip-angle, the TR, and the inversion-efficiency. As described above, the numerical simulations and the phantom experiments show that the loss in accuracy with the exemplary sequence is substantially lower than for the case of the repeated imaging of a disturbed longitudinal magnetization used in MOLLI. Further, a fit with the two-parameter fit model provides a substantially high precision with a trade-off of decreased accuracy.

In the above examples of the phantom and in vivo imaging, the flip-angle is 35 degrees, which was selected to control the loss in accuracy if a two-parameter fit model is used for the reconstruction. A greater flip-angle causes greater disturbance of the magnetization before the acquisition of the central k-space line. Hence, if the STONE sequence is used with the two-parameter fit model with a greater flip-angle, the accuracy of the method may be impaired. On the other hand, a greater flip-angle leads to an improved image SNR, resulting in a better precision. Hence, if the STONE sequence is used with a three-parameter fit model, the application of a greater value of a flip-angle may increase the precision, without impairing the accuracy. Sufficient rest periods may be inserted, as applicable.

The STONE sequence may also be applied for post-contrast T1 mapping. The precise estimation of short post-contrast T1 times may need a denser sampling of short-inversion times. With the STONE sequence, this may be achieved by reducing the number of slices, and increasing the number of imaging sets by varying the TI. In addition to post-contrast T1 of myocardium, the blood T1 may be needed for calculation of ECV. For blood T1, the impact of inflow saturation and disturbance of the inflowing blood need to be taken into account. However for blood T1, usually only a single value is needed.

Exemplary embodiments may be implemented by software or hardware components such as a field-programmable gate array (FPGA) or an application-specific integrated circuit (ASIC). The hardware component may include a storage medium capable of addressing, or may be configured to be executed by one or more processors. Software component may include object-oriented software components, class components, and task components, and processes, functions, attributes, procedures, subroutines, segments of a program code, drivers, firmware, a micro code, a circuit, data, a database, data structures, tables, arrays, and variables. Functions provided by different components may be combined into a smaller number of components or may be further separated into additional components.

The foregoing exemplary embodiments and advantages are merely exemplary and are not to be construed as limiting. The present teaching may be readily applied to other types of apparatuses. Also, the description of the exemplary embodiments is intended to be illustrative, and not to limit the scope of the claims, and many alternatives, modifications, and variations will be apparent to those skilled in the art.

The invention claimed is:

1. A magnetic resonance imaging (MRI) method comprising:
performing, by an MRI apparatus, a first data acquisition block of a pulse sequence including a first imaging sequence, which includes first sets of slice-selective excitation pulses, to acquire a first magnetic resonance (MR) data from a plurality of slices of a subject during a period of fully recovered longitudinal magnetization within the plurality of slices disposed at different locations in the subject, wherein the performing the first data acquisition block includes executing each of the first sets of the slice-selective, excitation pulses to individually excite, in one cardiac cycle of the subject, among cardiac cycles, each single slice of the plurality of slices once;
performing, by the MRI apparatus, a second data acquisition block of the pulse sequence that includes a magnetization preparation module and a second imaging sequence, which includes second sets of slice-selective excitation pulses and is executed during a recovery period following the magnetization preparation module, to acquire a second MR data from the plurality of slices during the recovery period, wherein the performing the second data acquisition block includes executing each of the second sets of the slice-selective excitation pulses to individually excite, in one cardiac cycle of the subject, among the cardiac cycles, each single slice of the plurality of slices once after the magnetization preparation module is executed; and
generating, by the MRI apparatus, a longitudinal relaxation time (T1) map of the subject based on the first MR data and the second MR data, of the plurality of slices.

2. The method of claim 1, wherein the performing the second data acquisition block further includes performing an iterative execution of the second data acquisition block, by ordering the plurality of slices differently in each consecutive execution, to acquire the second MR data of the plurality of slices with different inversion times after an execution of the magnetization preparation module, and
the generating includes reconstructing an image by interleaving the first MR data and the second MR data for the plurality of slices.

3. The method of claim 1, wherein the magnetization preparation module includes a non-selective inversion pulse causing a single inversion of longitudinal magnetization.

4. The method of claim 3, wherein the performing the second data acquisition block further comprises:
performing a navigator acquisition to acquire navigator image data following the single inversion of longitudinal magnetization and before performing the slice-selective excitation pulses to acquire the second MR data of the plurality of slices during a free-breathing of the subject.

5. The method of claim 4, wherein the generating the T1 map includes performing prospective gating using the navigator image data.

6. The method of claim 3, wherein the generating the T1 map includes applying the first MR data and the second MR data to a two-parameter fit model for an inversion recovery signal $S_{2p}$, where:

$$S_{2p}(t) = M_0(1 - 2e^{-t/T1}),$$

where $M_0$ is the inversion recovery signal with full longitudinal magnetization recovery derived from the first MR data, and
t is an inversion time.

7. The method of claim 3, wherein the generating the T1 map includes applying the first MR data and the second MR data to a three-parameter fit model for an inversion recovery signal $S_{3p}$, where:

$$S_{3p}(t) = M_0(1 - Be^{-t/T1}),$$

where $M_0$ is the inversion recovery signal with full longitudinal magnetization recovery derived from the first MR data,
t is an inversion time, and
B is a variable that models apparent inversion efficiency of the single inversion of longitudinal magnetization.

8. The method of claim 1, further comprising:
gating an acquisition of the first MR data and the second MR data from the plurality of slices based on an RR interval in each of the cardiac cycles of the subject,
wherein each of the first sets of the slice-selective excitation pulses and each of the second sets of the slice-selective excitation pulses are performed at a corresponding location in each of the cardiac cycles of the subject.

9. The method of claim 1, wherein each of the first data acquisition block and the second data acquisition block further comprises a rest period, respectively, following an acquisition of the first MR data or the second MR data from a last-ordered slice of the plurality of slices.

10. The method of claim 9, wherein the rest period is equal to or less than 5 seconds.

11. A non-transitory computer-readable storage medium having recorded thereon computer instructions which, when executed by a computer, cause the computer to perform the method of claim 1.

12. An MR scanner comprising a processor configured to perform the method of claim 1.

13. The method of claim 1, wherein the first data acquisition block and the second data acquisition block are performed during a free-breathing of the subject.

14. A magnetic resonance imaging (MRI) apparatus comprising:
a data processor configured to acquire a first magnetic resonance (MR) data and a second MR data, from a plurality of slices disposed in different locations in a subject;
a pulse sequence controller configured to generate a pulse sequence and apply the pulse sequence to a gradient coil assembly and an RF coil assembly,
wherein the pulse sequence controller is further configured to execute a first data acquisition block of the pulse sequence, the first data acquisition block including a first imaging sequence including first sets of slice-selective excitation pulses, to acquire the first MR data from the plurality of slices during a period of fully recovered longitudinal magnetization within the plurality of slices, and to execute a second data acquisition block of the pulse sequence, the second data acquisition block including a magnetization preparation module and a second imaging sequence, which includes second sets of slice-selective excitation pulses and is executed during a recovery period following the magnetization preparation module, to acquire the second MR data from the plurality of slices during the recovery period,
wherein the pulse sequence controller is further configured to execute each of the first sets of the slice-selective excitation pulse to individually excite, in one cardiac cycle of the subject, among cardiac cycles, each single slice of the plurality of slices once, and to execute each of the second sets of the slice-selective excitation pulses to individually excite, in one cardiac cycle of the subject, among the cardiac cycles, each single slice of the plurality of slices once after the magnetization preparation module is executed; and an image processor configured to generate a longitudinal relaxation time (T1) map of the subject, for the plurality of slices, based on the first MR data and the second MR data.

15. The MRI apparatus of claim 14, wherein the data processor is further configured to control the pulse sequence controller to iteratively execute the second data acquisition block, by ordering the plurality of slices differently in each consecutive execution, to acquire the second MR data of the plurality of slices with different inversion times after an execution of the magnetization preparation module, and the image processor is further configured to reconstruct an image by interleaving the first MR data and the second MR data for the plurality of slices.

16. The MRI apparatus of claim 14, wherein the magnetization preparation module includes a non-selective inversion pulse causing a single inversion of longitudinal magnetization.

17. The MRI apparatus of claim 16, wherein the pulse sequence controller is further configured to control gating of an acquisition of the first MR data and the second MR data from the plurality of slices based on an RR interval in each of the cardiac cycles of the subject, and each set of the first sets of the slice-selective excitation pulses and each of the second sets of the slice-selective excitation pulses are performed at a corresponding location in each of the cardiac cycles of the subject.

18. The MRI apparatus of claim 16, wherein the data processor is further configured to acquire navigator image data following the single inversion of longitudinal magnetization and before the slice-selective excitation pulses are performed to acquire the second MR data for the plurality of slices during a free-breathing of the subject.

19. The MRI apparatus of claim 18, wherein the image processor is further configured to perform prospective gating using the navigator image data.

20. The MRI apparatus of claim 16, wherein the image processor is further configured to apply the first MR data and the second MR data to a two-parameter fit model for an inversion recovery signal $S_{2p}$, where:

$$S_{2p}(t)=M_0(1-2e^{-t/T1}),$$

where $M_0$ is the inversion recovery signal with full longitudinal magnetization recovery derived from the first MR data, and t is an inversion time.

21. The MRI apparatus of claim 16, wherein the image processor is further configured to apply the first MR data and the second MR data to a three-parameter fit model for an inversion recovery signal $S_{ap}$, where:

$$S_{3p}(t)=M_0(1-Be^{-t/T1}),$$

where $M_0$ is the inversion recovery signal with full longitudinal magnetization recovery derived from the first MR data, t is an inversion time, and B is a variable that models apparent inversion efficiency of the single inversion of longitudinal magnetization.

22. The MRI apparatus of claim 14, wherein the pulse sequence controller is further configured to perform a rest period following an acquisition of at least one of the first MR data or the second MR data from a last-ordered slice of the plurality of slices.

23. The MRI apparatus of claim 22, wherein the rest period is equal to or less than 5 seconds.

* * * * *